United States Patent
Donohue et al.

(10) Patent No.: US 7,972,483 B2
(45) Date of Patent: Jul. 5, 2011

(54) METHOD OF FAULT DETECTION FOR MATERIAL PROCESS SYSTEM

(75) Inventors: John Donohue, Hillsboro, OR (US); Hongyu Yue, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 2265 days.

(21) Appl. No.: 10/500,005

(22) PCT Filed: Dec. 31, 2002

(86) PCT No.: PCT/US02/38989
§ 371 (c)(1), (2), (4) Date: Feb. 14, 2005

(87) PCT Pub. No.: WO03/058699
PCT Pub. Date: Jul. 17, 2003

(65) Prior Publication Data
US 2005/0115824 A1 Jun. 2, 2005

Related U.S. Application Data

(60) Provisional application No. 60/343,175, filed on Dec. 31, 2001.

(51) Int. Cl.
*C23C 14/22* (2006.01)
(52) U.S. Cl. .............. 204/192.13; 204/298.03; 438/14
(58) Field of Classification Search ............. 204/192.13, 204/298.03; 438/14
See application file for complete search history.

(56) References Cited

U.S. PATENT DOCUMENTS

| | | | |
|---|---|---|---|
| 5,009,485 A | 4/1991 | Hall | |
| 5,601,869 A * | 2/1997 | Scott et al. | 427/126.3 |
| 5,658,423 A * | 8/1997 | Angell et al. | 438/9 |
| 5,711,849 A | 1/1998 | Flamm et al. | |
| 5,770,922 A * | 6/1998 | Gerrish et al. | 315/111.21 |
| 5,786,023 A | 7/1998 | Maxwell et al. | |
| 5,910,011 A | 6/1999 | Cruse | |
| 6,232,134 B1 | 5/2001 | Farber et al. | |

FOREIGN PATENT DOCUMENTS

JP 11-87323 3/1999
WO WO 01/99145 A1 12/2001

* cited by examiner

*Primary Examiner* — Nam X Nguyen
*Assistant Examiner* — Jason M Berman
(74) *Attorney, Agent, or Firm* — Oblon, Spivak, McClelland, Maier & Neustadt, L.L.P.

(57) ABSTRACT

A method for material processing utilizing a material processing system to perform a process. The method performs a process (510), measures a scan of data (520), and transforms the data scan (530) into a signature (540) including at least one spatial component. The scan of data (530) can include a process performance parameter such as an etch rate, an etch selectivity, a deposition rate, a film property, etc. The signature (540) can be stored (550), and compared with either a previously acquired signature or with an ideal signature (560). If at least one spatial component substantially deviates from the reference spatial component, then a process fault has potentially occurred. If the cumulative deviation of all spatial components or a select group of components substantially deviates from a reference set of spatial components, then a process fault has potentially occurred.

22 Claims, 22 Drawing Sheets

| | Hi P | Lo P | Hi He | Lo He | Hi CF4 | Lo CF4 | Hi RF | Lo RF | Hi Temp | Lo Temp | 12mm FR | 20mm FR |
|---|---|---|---|---|---|---|---|---|---|---|---|---|
| ONE | 800.0 | -440.0 | -900.0 | 770.0 | | 221.0 | 126.0 | -68.0 | 90.0 | -198.0 | 340.0 | -379.0 |
| TWO | | | -200.0 | | -168.0 | | 14.0 | | | | 68.0 | |
| THREE | 400.0 | -110.0 | | 177.0 | | | | -90.0 | 36.0 | | | -96.0 |
| FOUR | | | | | -75.0 | 89.0 | | | | | 89.0 | |
| FIVE | | | | 90.0 | -20.0 | | | | | | | |
| SIX | 55.0 | | | | | | -48.0 | | | | | |
| SEVEN | | | | | | 40.0 | | -20.2 | | | | |
| EIGHT | | | | | | | -8.0 | | | -11.0 | | |
| NINE | | | | | | | | | | | | |
| TEN | | | | | | | | | | -3.0 | | |
| ELEVEN | | | | | | | | | | | | |
| TWELVE | | | | | | | | | | | | -5.0 |
| THIRTEEN | | | | | | | | | | | | |
| FOURTEEN | | | | | | | | -4.5 | | | | |
| FIFTEEN | | | | | | | | | | | | -5.3 |
| SIXTEEN | | | | | | | | | | | | -1.4 |

FIG. 11

| f₁ | f₂ | f₃ | f₄ |
|---|---|---|---|
| Hi He | Lo RF | HiCF4 | HiCF4 |
| Lo Temp | | | |
| Lo Press | | | |
| 20mm FR | | | |
| Lo RF | | | |

|  | Lo P | Hi He | Hi CF4 | Lo RF | Lo Temp | 20mm FR | Sum |
|---|---|---|---|---|---|---|---|
| ONE | -440.0 | -900.0 |  | -68.0 | -198.0 | -379.0 | -1985.0 |
| TWO | -110.0 | -200.0 | -168.0 |  |  |  | -358.0 |
| THREE | -110.0 |  |  | -90.0 |  | -96.0 | -296.0 |
| FOUR |  |  | -75.0 |  |  |  | -75.0 |
| FIVE |  |  | -20.0 |  |  |  | -20.0 |
| SIX |  |  |  |  |  |  | 0.0 |
| SEVEN |  |  |  | -20.2 |  |  | -20.2 |
| EIGHT |  |  |  |  | -11.0 |  | -11.0 |
| NINE |  |  |  |  |  |  | 0.0 |
| TEN |  |  |  |  | -3.0 |  | -3.0 |
| ELEVEN |  |  |  |  |  |  | 0.0 |
| TWELVE |  |  |  |  |  | -5.0 | -5.0 |
| THIRTEEN |  |  |  |  |  |  | 0.0 |
| FOURTEEN |  |  |  | -4.5 |  |  | -4.5 |
| FIFTEEN |  |  |  |  |  | -5.3 | -5.3 |
| SIXTEEN |  |  |  |  |  | -1.4 | -1.4 |

METHOD OF FAULT DETECTION FOR MATERIAL PROCESS SYSTEM

CROSS-REFERENCE TO RELATED APPLICATIONS

This application claims priority and is related to U.S. application Ser. No. 60/343,175, filed on Dec. 31, 2001, the contents of which are herein incorporated by reference. This application is related to co-pending PCT application serial No. PCT/US02/38990, filed on even date herewith, the contents of which are herein incorporated by reference.

BACKGROUND OF THE INVENTION

1. Field of the Invention

The present invention relates to material processing and more particularly to a method for fault detection for material process system.

2. Description of Related Art

One area of material processing in the semiconductor industry which presents formidable challenges is, for example, the manufacture of integrated circuits (ICs). Demands for increasing the speed of ICs in general, and memory devices in particular, force semiconductor manufacturers to make devices smaller and smaller on the wafer surface. And conversely, while shrinking device sizes on the substrate is incurred, the number of devices fabricated on a single substrate is dramatically increased with further expansion of the substrate diameter (or processing real estate) from 200 mm to 300 mm and greater. Both the reduction in feature size, which places greater emphasis on critical dimensions (CD), and the increase of substrate size lead to even greater requirements on material processing uniformity to maximize the yield of superior devices.

Typically, during materials processing, one method to facilitate the addition and removal of material films when fabricating composite material structures includes, for example, the use of plasma. For example, in semiconductor processing, a (dry) plasma etch process is utilized to remove or etch material along fine lines or within vias or contacts patterned on a silicon substrate.

During, for example, material processing in IC fabrication, shrinking critical feature sizes, increasing substrate sizes and escalating numbers and complexities of processes lead to the necessity to control the material processing uniformity throughout the lifetime of a process and from process-to-process. The lack of uniformity in simply one process measurable generally requires the sacrifice of other important process parameters, at least, somewhere during the process. In material processing, the lack of process uniformity can, for example, cause a costly reduction in the yield of superior devices.

Attempts to design material processing hardware either to produce uniform processing properties or correct for known non-uniformities are further complicated by the expansive set of independent parameters, the complexity of these material processing devices, and simply the exorbitant cost and lack of robustness of such material processing devices. Furthermore, for conventional material processing devices, the number of externally, controllable parameters are severely limited to only a few known, adjustable parameters. Therefore, it is essential that the inter-relations between all externally controllable parameters and measurable process parameters are derived and made useful throughout the lifetime of a process and from process-to-process.

SUMMARY OF THE INVENTION

The present invention provides for a method of material processing, wherein the method comprises utilizing a material processing system, the material processing system comprising a process chamber, a device for measuring and adjusting at least one controllable process parameter, and a device for measuring at least one process performance parameter.

The present invention provides a method of characterizing a process, the characterizing comprising identifying a signature of the process wherein the signature comprises at least one spatial component; optimizing the process, the optimizing comprising identifying a reference signature; comparing the signature of the process with the reference signature for the process, wherein the comparing comprises determining a difference signature, and determining a process fault by comparing the difference signature with a threshold, wherein the process fault occurs when the threshold is exceeded.

BRIEF DESCRIPTION OF THE DRAWINGS

These and other objects and advantages of the invention will become more apparent and more readily appreciated from the following detailed description of the exemplary embodiments of the invention taken in conjunction with the accompanying drawings, where:

FIG. 11 presents an exemplary table of variations in spatial components provided changes in controllable process parameters;

FIG. 16A presents a table of spatial components for a reduced set of the data of the table presented in FIG. 11;

DETAILED DESCRIPTION OF EXEMPLARY EMBODIMENTS

Figure 1:
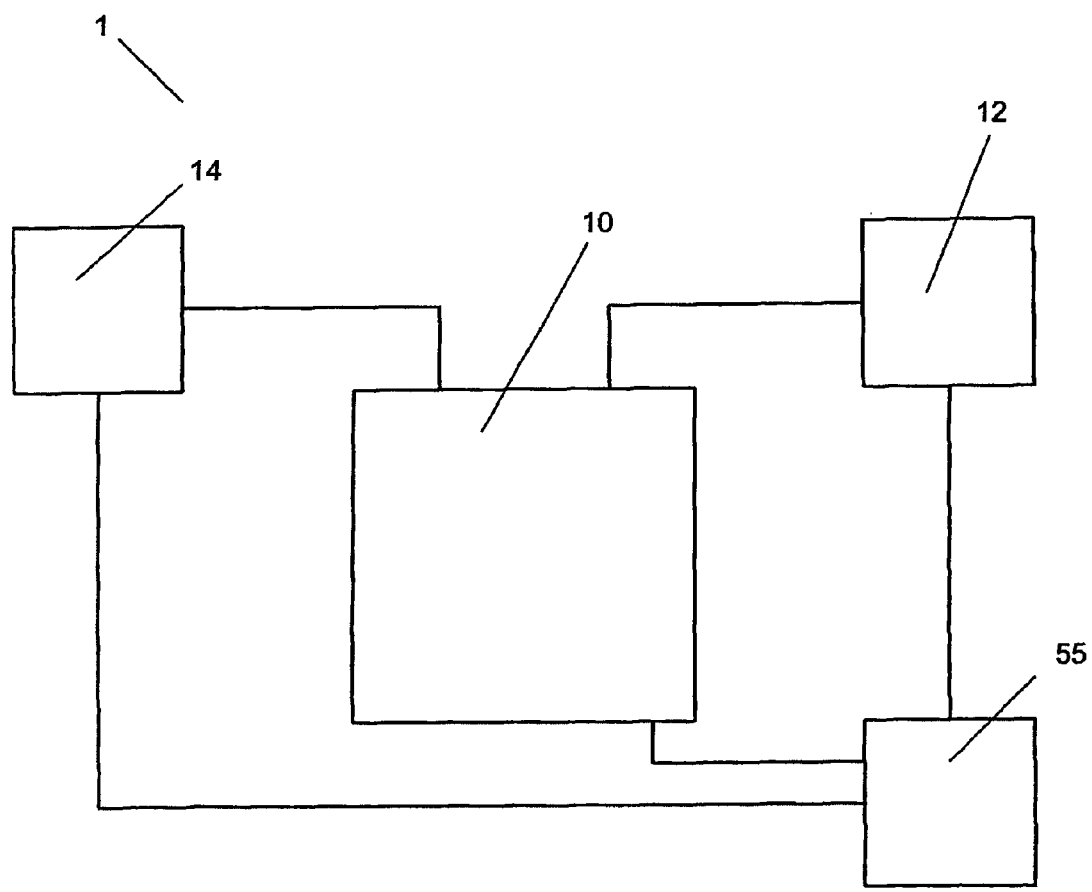
FIG. 1 shows a material processing system according to a preferred embodiment of the present invention.

According to an embodiment of the present invention, a material processing system 1 is depicted in FIG. 1 comprising a process chamber 10, a device for measuring and adjusting at least one controllable process parameter 12, a device for measuring at least process performance parameter 14, and a controller 55. The controller 55 is coupled to the device for measuring and adjusting at least one controllable process parameter 12 and the device for measuring at least one process performance parameter. Moreover, the controller 55 is capable of executing the method of performing a process to be described.

In the illustrated embodiment, material processing system 1, depicted in FIG. 1, utilizes a plasma for material processing. Desirably, material processing system 1 comprises an etch chamber. Alternately, material processing system 1 comprises a photoresist coating chamber such as, for example, a photoresist spin coating system. In another embodiment, material processing system 1 comprises a photoresist patterning chamber such as, for example, a ultraviolet (UV) lithography system. In another embodiment, material processing system 1 comprises a dielectric coating chamber such as, for example, a spin-on-glass (SOG) or spin-on-dielectric (SOD) system. In another embodiment, material processing system 1 comprises a deposition chamber such as, for example, a chemical vapor deposition (CVD) system or a physical vapor deposition (PVD) system. In an additional embodiment, material processing system 1 comprises a rapid thermal processing (RTP) chamber such as, for example, a RTP system for thermal annealing. In another embodiment, material processing system 1 comprises a batch diffusion furnace.

Figure 2:
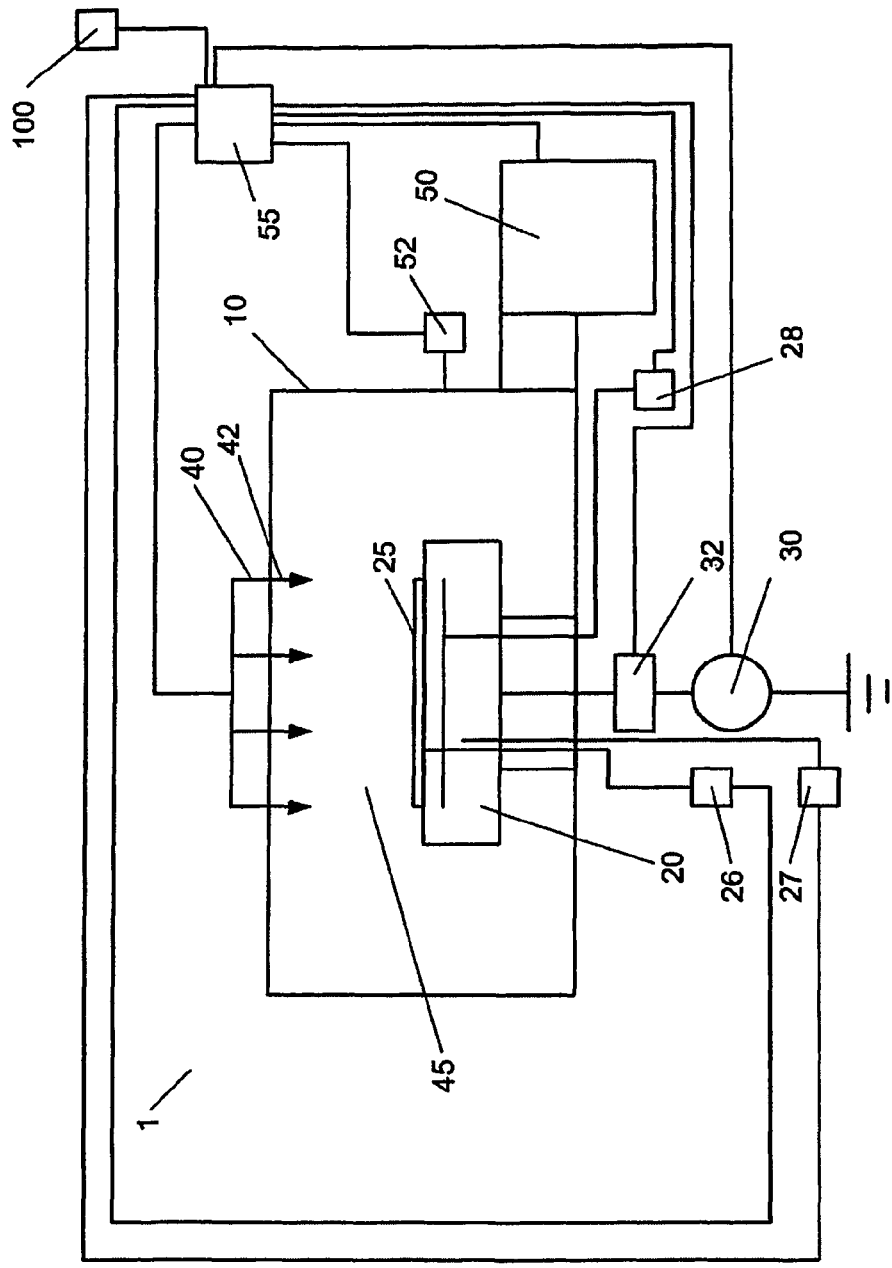
FIG. 2 shows a material processing system according to an alternate embodiment of the present invention.

According to the illustrated embodiment of the present invention depicted in FIG. 2, material processing system 1 can comprise process chamber 10, substrate holder 20, upon which a substrate 25 to be processed is affixed, gas injection system 40, and vacuum pumping system 50. Substrate 25 can be, for example, a semiconductor substrate, a wafer or a liquid crystal display. Process chamber 10 can be, for example, configured to facilitate the generation of plasma in processing region 45 adjacent a surface of substrate 25, wherein plasma is formed via collisions between heated electrons and an ionizable gas. An ionizable gas or mixture of gases is introduced via gas injection system 40 and the process pressure is adjusted. For example, a control mechanism (not shown) can be used to throttle the vacuum pumping system 50. Desirably, plasma is utilized to create materials specific to a pre-determined materials process, and to aid either the deposition of material to substrate 25 or the removal of material from the exposed surfaces of substrate 25.

Substrate 25 can be, for example, transferred into and out of chamber 10 through a slot valve (not shown) and chamber feed-through (not shown) via robotic substrate transfer system where it is received by substrate lift pins (not shown) housed within substrate holder 20 and mechanically translated by devices housed therein. Once substrate 25 is received from substrate transfer system, it is lowered to an upper surface of substrate holder 20.

Desirably, the substrate 25 can be, for example, affixed to the substrate holder 20 via an electrostatic clamping system 28. Furthermore, substrate holder 20 can further include a cooling system including a recirculating coolant flow that receives heat from substrate holder 20 and transfers heat to a heat exchanger system (not shown), or when heating, transfers heat from the heat exchanger system. The heating/cooling system further comprises a device 27 for monitoring the substrate 25 and/or substrate holder 20 temperature. The device 27 can be, for example, a thermocouple (e.g. K-type thermocouple), pyrometer, or optical thermometer. Moreover, gas can be delivered to the back-side of the substrate via a backside gas system 26 to improve the gas-gap thermal conductance between substrate 25 and substrate holder 20. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermoelectric heaters/coolers can be included.

In the illustrated embodiment, shown in FIG. 2, substrate holder 20 can, for example, further serve as an electrode through which RF power is coupled to plasma in processing region 45. For example, substrate holder 20 is electrically biased at a RF voltage via the transmission of RF power from RF generator 30 through impedance match network 32 to substrate holder 20. The RF bias can serve to heat electrons and, thereby, form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz (e.g., 13.56 MHz). RF systems for plasma processing are well known to those skilled in the art.

Alternately, RF power is applied to the substrate holder electrode at multiple frequencies. Furthermore, impedance match network 32 serves to maximize the transfer of RF power to plasma in processing chamber 10 by minimizing the reflected power. Match network topologies (e.g. L-type, π-type, T-type, etc.) and automatic control methods are well known to those skilled in the art.

With continuing reference to FIG. 2, process gas 42 can be, for example, introduced to processing region 45 through gas injection system 40. Process gas 42 can, for example, comprise a mixture of gases such as argon, $CF_4$ and $O_2$, or argon, $C_4F_8$ and $O_2$ for oxide etch applications. Gas injection system 40 can comprise a showerhead, wherein process gas 42 is supplied from a gas delivery system (not shown) to the processing region 45 through a gas injection plenum (not shown), a series of baffle plates (not shown) and a multi-orifice showerhead gas injection plate (not shown). Gas injection systems are well known to those of skill in the art.

Vacuum pump system 50 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump can be used. Furthermore, a device for monitoring chamber pressure 52 is coupled to the chamber 10. The pressure measuring device 52 can be, for example, a Type 628B Baratron absolute capacitance manometer commercially available from MKS Instruments, Inc. (Andover, Mass.).

Material processing system 1 further comprises a metrology tool 100 to measure process performance parameters such as, for example for etch systems, an etch rate, an etch selectivity (i.e. ratio of etch rate of one material to etch rate of a second material), an etch uniformity, a feature profile angle, a critical dimension, etc. The metrology tool 100 can be either an in-situ or ex-situ device. For an in-situ device, the metrology tool 100 can be, for example, a scatterometer, incorporating beam profile ellipsometry and beam profile reflectometry, commercially available from Therma-Wave, Inc. (1250 Reliance Way, Fremont, Calif. 94539) which is positioned within the transfer chamber (not shown) to analyze substrates 25 transferred into and out of process chamber 10. For an ex-situ device, the metrology tool 100 can be, for example, a scanning electron microscope (SEM) wherein substrates have been cleaved and features are illuminated to determine the above performance parameters. The latter approach is well known to those skilled in the art of substrate inspection. The metrology tool is further coupled to controller 55 to provide controller 55 with spatially resolved measurements of the process performance parameters.

Controller 55 comprises a microprocessor, memory, and a digital I/O port capable of generating control voltages sufficient to communicate and activate inputs to material processing system 1 as well as monitor outputs from material processing system 1. Moreover, controller 55 is coupled to and exchanges information with RF generator 30, impedance match network 32, gas injection system 40, vacuum pump system 50, pressure measuring device 52, backside gas delivery system 26, substrate/substrate holder temperature measurement system 27, electrostatic clamping system 28, and metrology tool 100. A program stored in the memory is utilized to activate the inputs to the aforementioned components of a material processing system 1 according to a stored process recipe. One example of controller 55 is a DELL PRECISION WORKSTATION 610™, available from Dell Corporation, Dallas, Tex.

Figure 3:
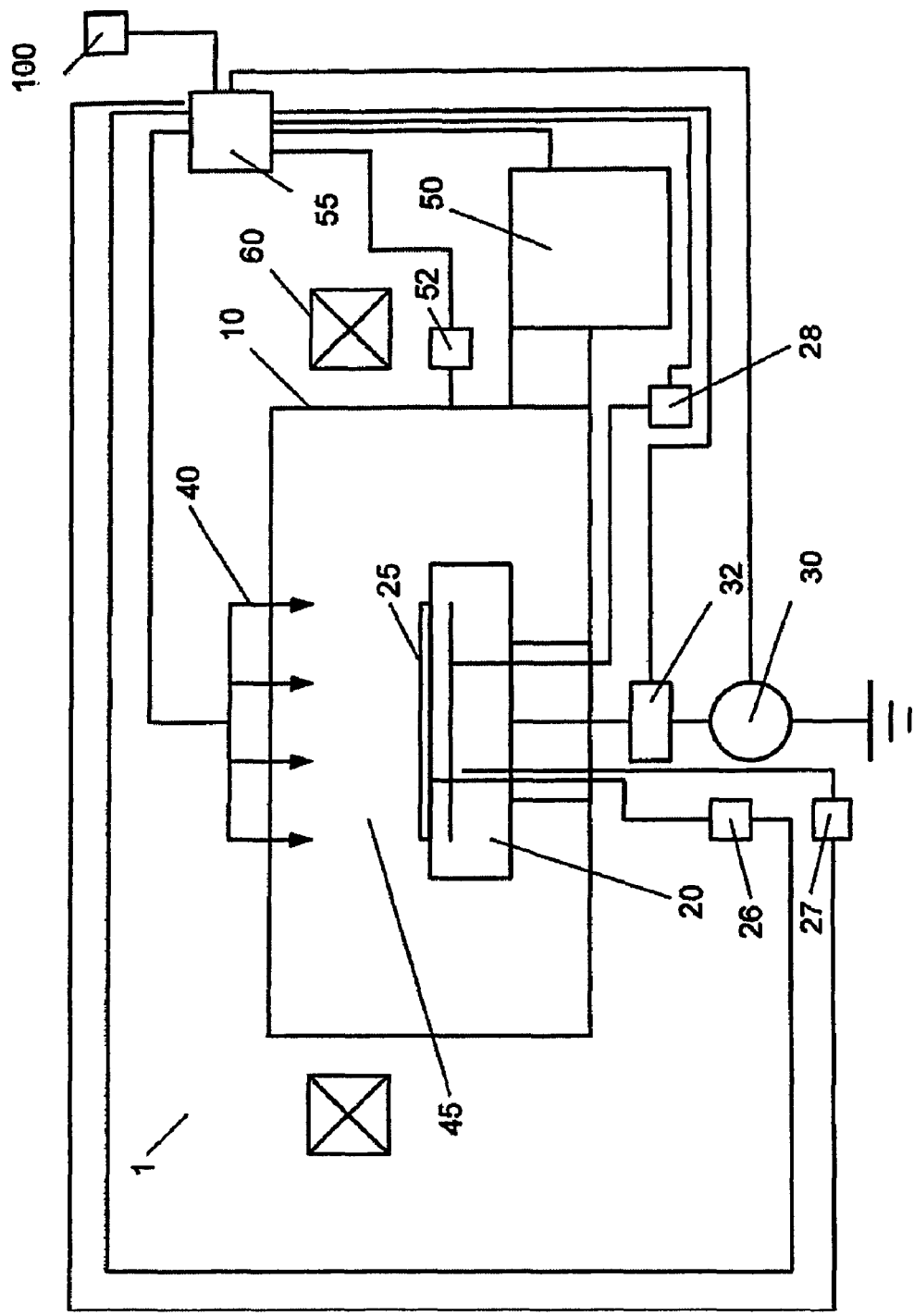
FIG. 3 shows a material processing system according to another embodiment of the present invention.

In the illustrated embodiment, shown in FIG. 3, the material processing system 1 can, for example, further comprise either a mechanically or electrically rotating DC magnetic field system 60, in order to potentially increase plasma density and/or improve plasma processing uniformity, in addition to those components described with reference to FIGS. 1 and 2. Moreover, controller 55 is coupled to rotating magnetic field system 60 in order to regulate the speed of rotation and field strength. The design and implementation of a rotating magnetic field is well known to those skilled in the art.

Figure 4:
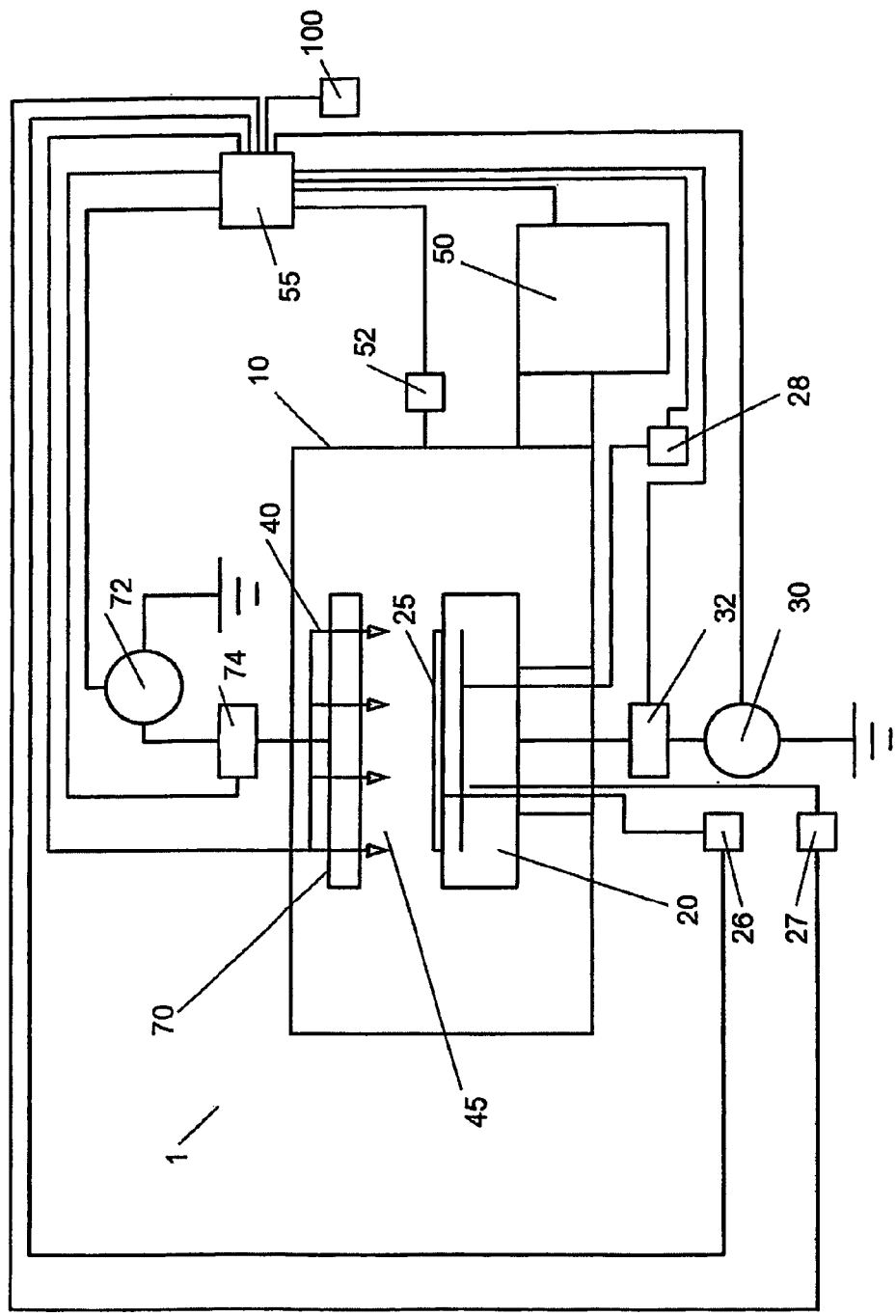
FIG. 4 shows a material processing system according to another embodiment of the present invention.

In the illustrated embodiment, shown in FIG. 4, the material processing system 1 of FIGS. 1 and 2 can, for example, further comprise an upper electrode 70 to which RF power can be coupled from RF generator 72 through impedance match network 74. A typical frequency for the application of RF power to the upper electrode can range from 10 MHz to 200 MHz (e.g., 60 MHz). Additionally, a typical frequency for the application of power to the lower electrode can range from 0.1 MHz to 30 MHz (e.g., 2 MHz). Moreover, controller 55 is coupled to RF generator 72 and impedance match network 74 in order to control the application of RF power to upper electrode 70. The design and implementation of an upper electrode is well known to those skilled in the art.

Figure 5:
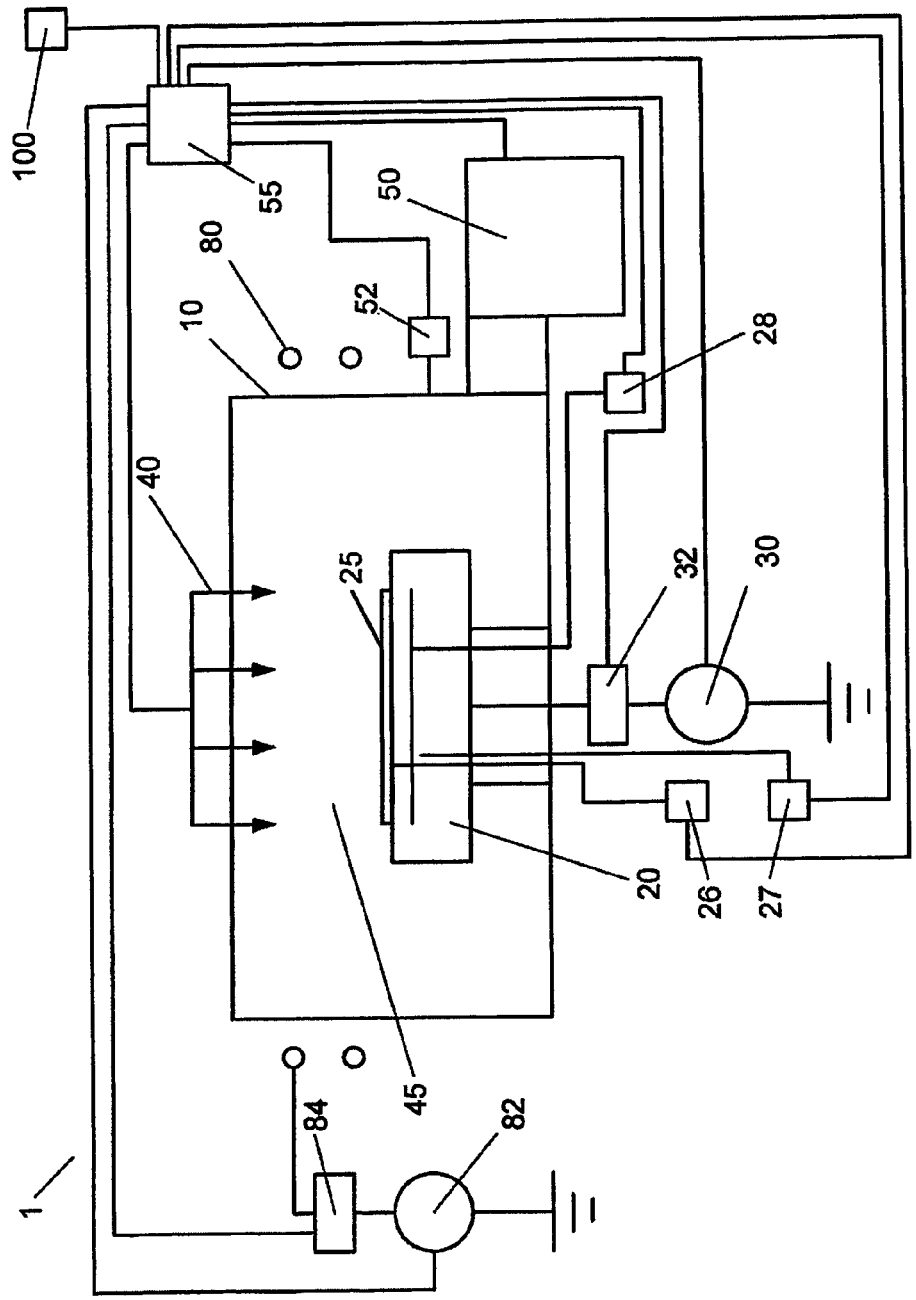
FIG. 5 shows a material processing system according to an additional embodiment of the present invention.

In the illustrated embodiment, shown in FIG. 5, the material processing system of FIG. 1 can, for example, further comprise an inductive coil 80 to which RP power is coupled via RF generator 82 through impedance match network 84. RF power is inductively coupled from inductive coil 80 through dielectric window (not shown) to plasma processing region 45. A typical frequency for the application of RF power to the inductive coil 80 can range from 10 MHz to 100 MHz (e.g., 13.56 MHz). Similarly, a typical frequency for the application of power to the chuck electrode can range from 0.1 MHz to 30 MHz (e.g., 13.56 MHz). In addition, a slotted Faraday shield (not shown) can be employed to reduce capacitive coupling between the inductive coil 80 and plasma. Alternately, coil 80 can be positioned above chamber 10 as a spiral-like coil such as in a transformer coupled plasma (TCP) source. Moreover, controller 55 is coupled to RF generator 82 and impedance match network 84 in order to control the application of power to inductive coil 80. The design and implementation of an inductively coupled plasma (ICP) source and a transformer coupled plasma (TCP) source are well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 6A:
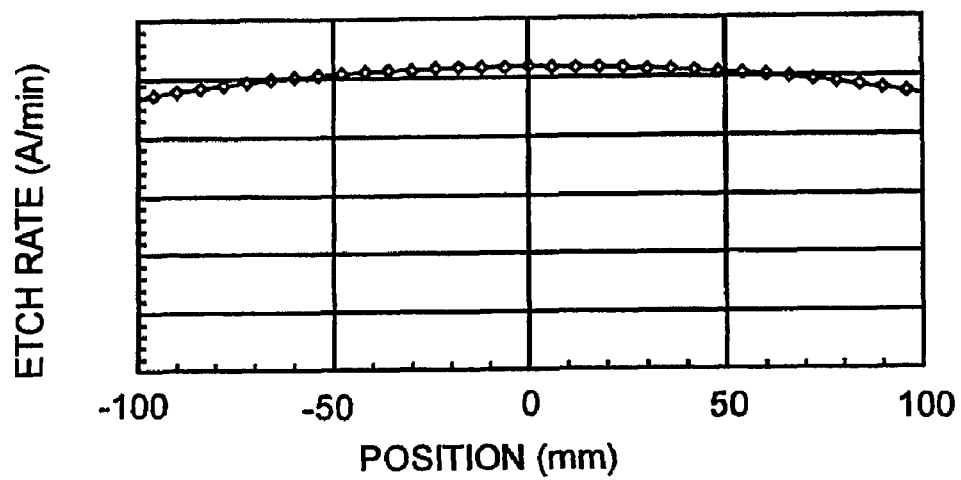
FIG. 6A presents a data scan of a first etch rate profile.

Referring now to FIGS. 1 through 5, substrates 25 are processed in process chamber 10 and some process performance parameters can be measured utilizing, for example, the metrology tool 100. Desirably, process performance parameters can include, for instance, etch rate, deposition rate, etch selectivity (ratio of the rate at which a first material is etched to the rate at which a second material is etched), an etch critical dimension (e.g. length or width of feature), an etch feature anisotropy (e.g. etch feature sidewall profile), a film property (e.g. film stress, porosity, etc.), a plasma density (obtained, for example, from a Langmuir probe), an ion energy (obtained, for example, from an ion energy spectrum analyzer), a concentration of a chemical specie (obtained, for example, from optical emission spectroscopy), a temperature, a pressure, a mask (e.g. photoresist) film thickness, a mask (e.g. photoresist) pattern critical dimension, etc. For example, FIG. 6A presents a substrate scan of the etch rate (Angstroms/minute, A/min) as a function of position (millimeters, mm) on a first substrate 25, where a position of zero (0) corresponds to the center of substrate 25 and a position of plus or minus (±) 100 corresponds to diametrically opposite edges of a, for example, (200 mm) substrate 25. Similarly, FIG. 7A presents a substrate scan of the etch rate versus substrate position for a second substrate 25.

Figure 7A:
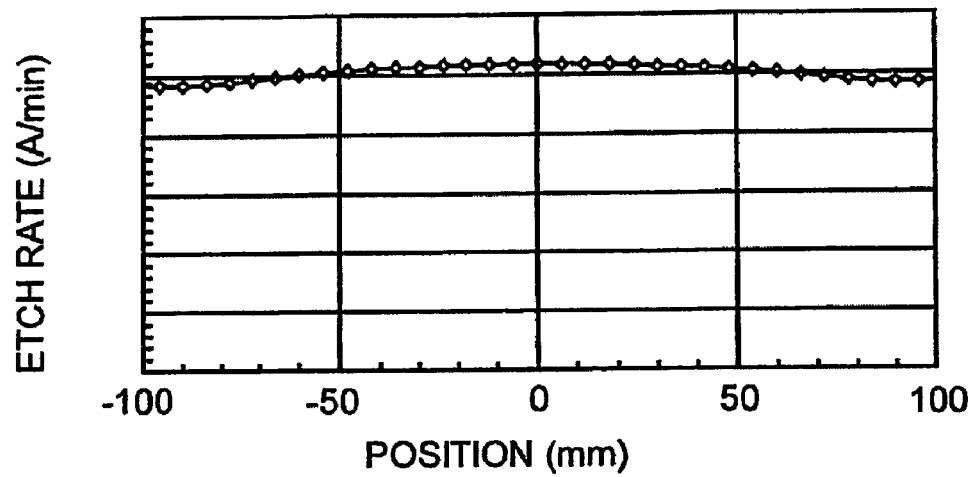
FIG. 7A presents a data scan of a second etch rate profile.

In FIGS. 6A and 7A, thirty-two (32) samples are taken along a full radial scan (edge-to-edge) of the substrate diameter; however, in general, the number of samples can be arbitrary, e.g. N samples where N≧2. The time T required to input the data at a sampling rate R can be expressed as T=N/R; i.e. T=N/R=(32 samples)/(1000 samples/second)=0.032 seconds (for sampling 32 points across a substrate at 1 kHz). For a data scan of period T, the primary spatial component is f=1/T and the highest spatial component must satisfy the Nyquist critical frequency of $f_{max} \leq \frac{1}{2}\Delta$, where $\Delta=T/N$. Therefore, in the above example, f=1/T=R/N=31.25 Hz and $f_{max}=\frac{1}{2}\Delta=R/2=500$ Hz.

In general, a scan of data, as described above, can be manipulated into spectral space and be represented by a set of orthogonal components. For example, if the samples are equally spaced in time (or space) and the scan is assumed to be periodic, then the data scan is directly amenable to the application of a discrete Fourier transform of the data to convert the data from physical space to Fourier (spectral) space. Moreover, if the samples are unequally spaced in time (or space), there exist methods of treating the data. These methods are known to those skilled in the art of data processing. When using a Fourier series representation of the data, the spatial components can be, for example, Fourier harmonics. Moreover, if the sampling period T is relatively small (small relative to the change of the data scan in time; applicable only for in-situ monitoring during substrate processing), then the Fourier spectrum can be regarded as a wavenumber spectrum and the minimum and maximum spatial components can be referred to as the minimum and maximum wavenumbers (or maximum and minimum wavelengths, respectively).

Figure 6B:
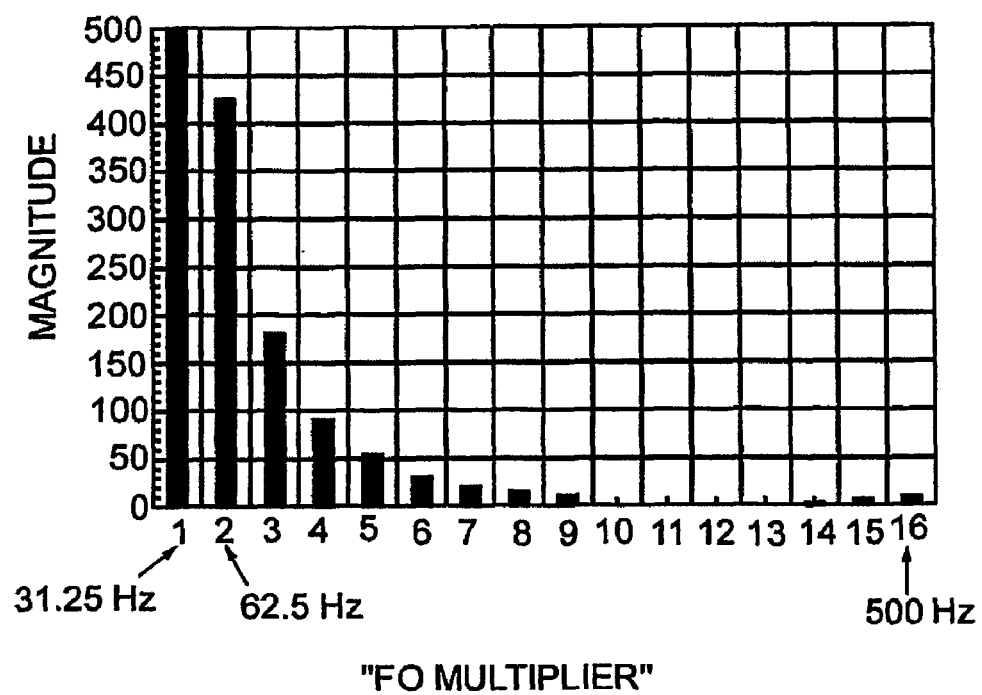
FIG. 6B presents a spectrum of spatial components for the data scan of FIG. 6A.
Figure 7B:
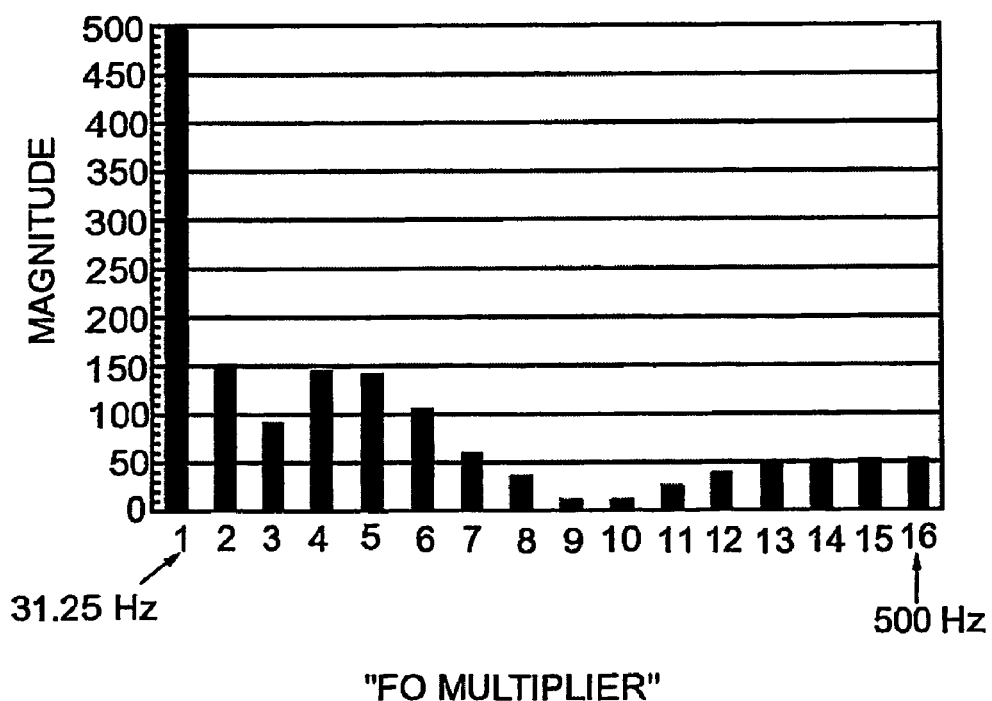
FIG. 7B presents a spectrum of spatial components for the data scan of FIG. 7A.

FIG. 6B presents the amplitude of each spatial component (i.e. $f_n=n/N\Delta$, n−1,N/2) for the data scan shown in FIG. 6A. And similarly, FIG. 7B presents the amplitude of each spatial component (i.e. $f_n=n/N\Delta$, n=1,N/2) for the data scan shown in FIG. 7A. In general, the following observations can be made: (1) the primary spatial component ($f_1$) has the largest magnitude and represents contributions from each point in the data scan (therefore, all points are interdependent; longest wavelength); and (2) the highest spatial component ($f_{N/2}$) has typically the smallest magnitude and it represents each point in the data scan separately (therefore, all points are independent of one another; smallest wavelength). Additionally, subtle changes in the etch rate profile (i.e. FIG. 6A versus FIG. 7A) can have a significant effect on the signature described by the spatial components in spectral space (i.e. FIG. 6B versus 7B).

Therefore, changes in the signature (spectrum) of spatial components can indicate whether the process variations leading to the observed spectral shifts are occurring globally over the substrate or locally over the substrate. In summary, changes in the amplitudes of the lower order spatial components (i.e. $f_1, f_2, f_3, \ldots$) reflect global variations of processing parameters above substrate 25, and changes in the amplitudes of the higher order spatial components (i.e. $\ldots, f_{N/2-2}, f_{N/2-1}, f_{N/2}$) reflect local variations of processing parameters above substrate 25.

Figure 8A:
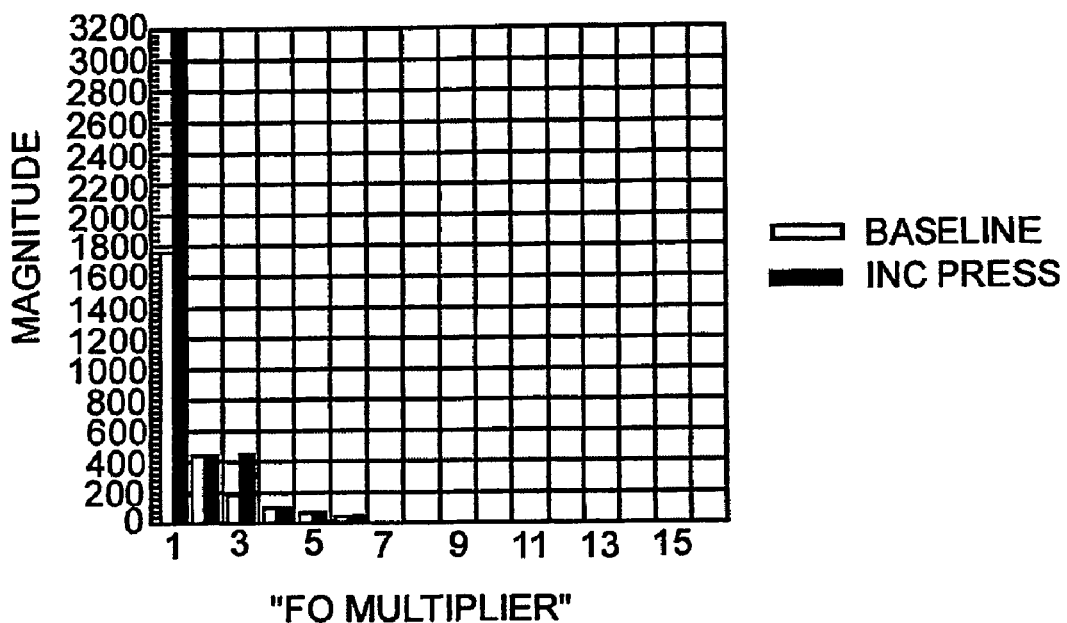
FIG. 8A presents a comparison of the spectrum of spatial components resulting from an increase in process pressure.
Figure 8B:
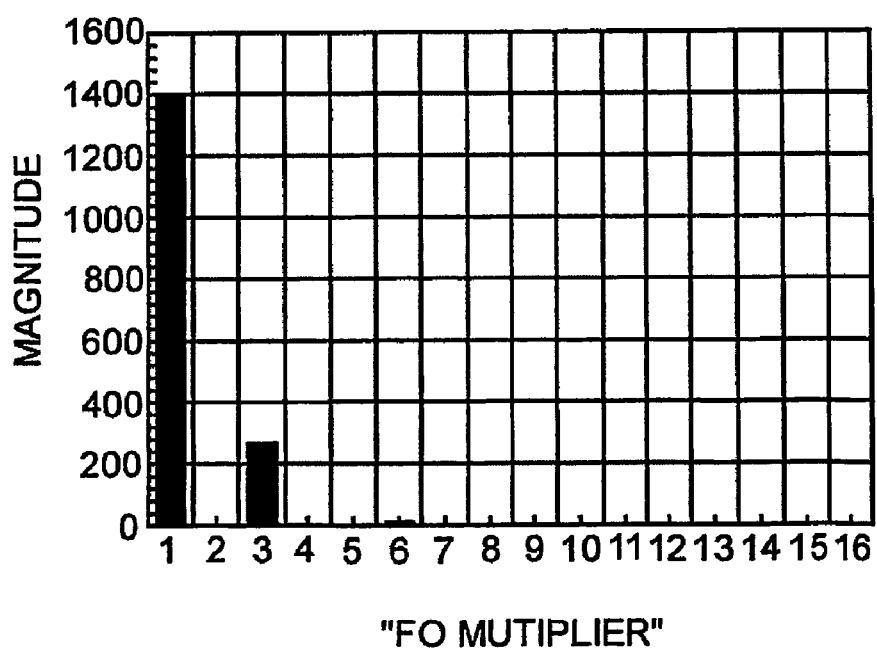
FIG. 8B presents the difference spectrum for the data of FIG. 8A.
Figure 9A:
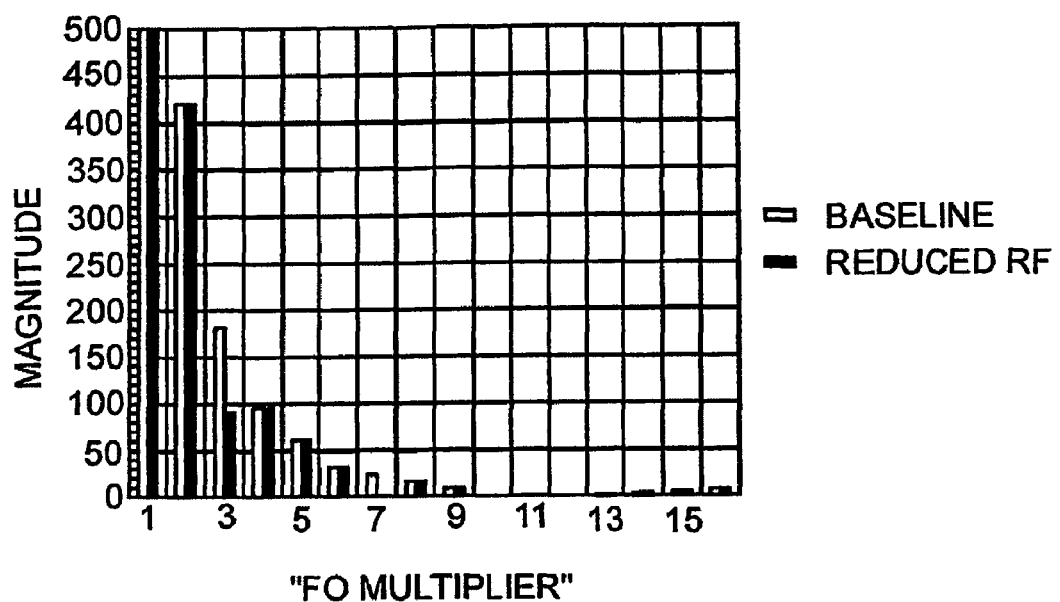
FIG. 9A presents a comparison of the spectrum of spatial components resulting from a decrease in RF power.
Figure 9B:
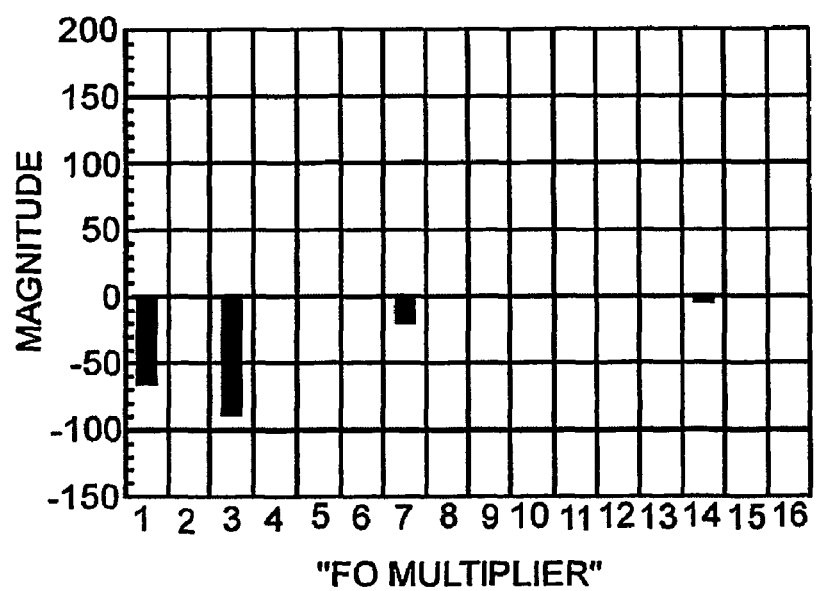
FIG. 9B presents the difference spectrum for the data of FIG. 9A.
Figure 9C:
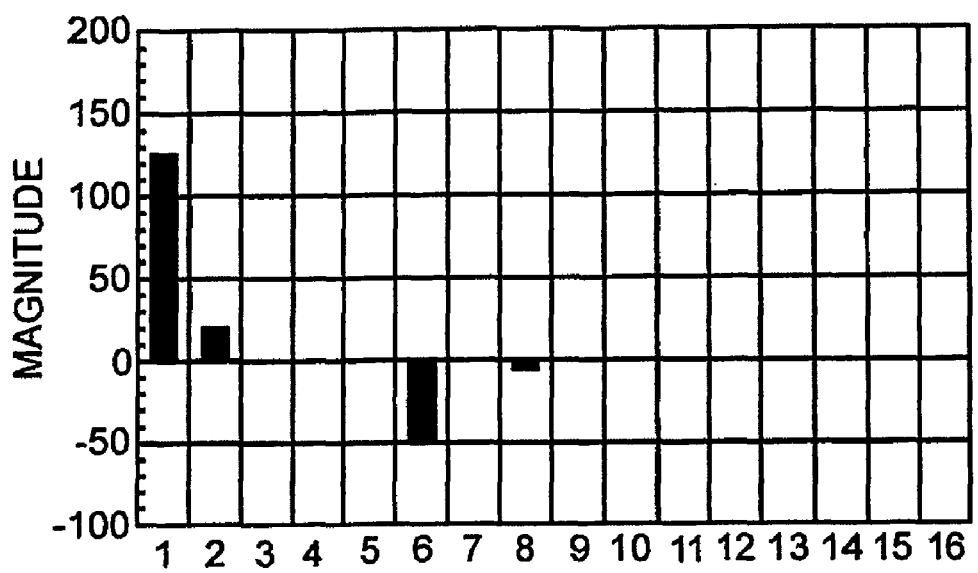
FIG. 9C presents the difference spectrum for an increase in RF power.

For example, a change in the pressure or RF power (e.g. an increase in the processing pressure or decrease in the RF power) is expected to have a global effect on the signature of spatial components and, hence, affect primarily the lower order components. FIG. 8A presents an example of raising the chamber pressure and its effect on the signature of spatial components, where FIG. 8B presents the respective difference signature. Similarly, FIG. 9A presents an example of reducing the RF power and its effect on the signature of spatial components, where FIG. 9B presents the respective difference signature (for reducing the RF power) and FIG. 9C presents the corresponding difference signature for increasing the RF power. Each difference signature provides a different spatial characteristic (i.e. "fingerprint") for each type of process change (i.e. increase or decrease in process pressure, increase or decrease in RF power, increase or decrease in mass flow rate of process gas, etc.).

Figure 10A:
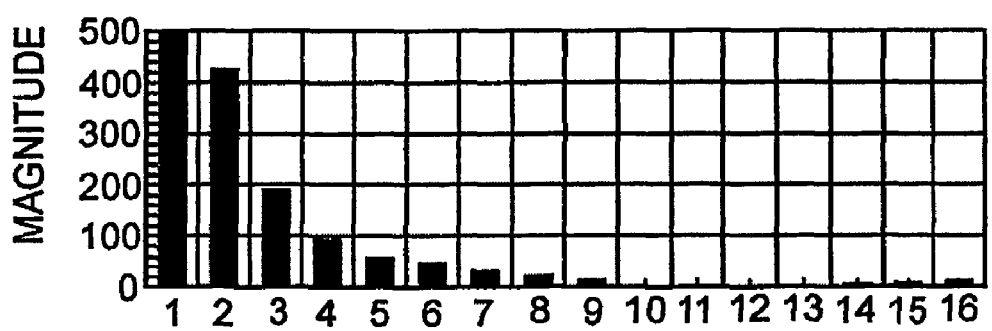
FIG. 10A shows an exemplary spectrum of spatial components for a non-uniform etch rate.
Figure 10B:
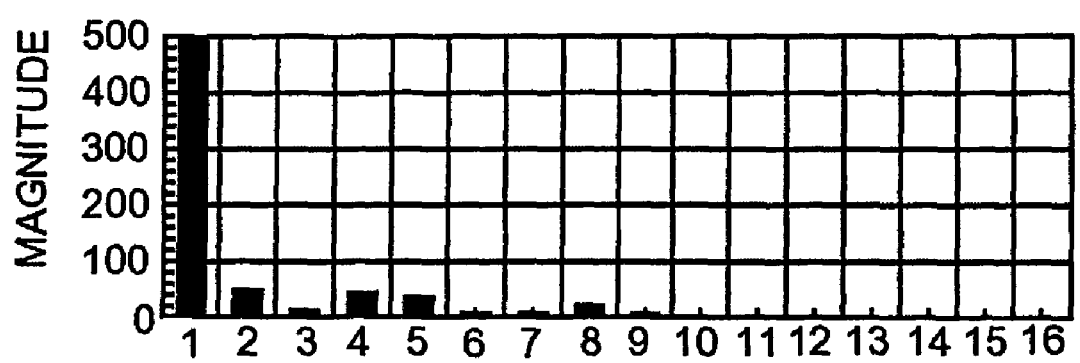
FIG. 10B shows an exemplary spectrum of spatial components for a uniform etch rate.

Since each process performed in material processing system 1 can be characterized by a signature of its spatial components, then one can evaluate the effect of process uniformity on the signature of spatial components. FIG. 10A presents a spatial signature for a non-uniform process and FIG. 10B presents a spatial signature for a uniform process. Clearly, the uniformity of a process can be directly correlated with an overall reduction in the magnitudes of each spatial component.

Since there exists a relationship between controllable process parameters and spectra of spatial components obtained from a scan of, for instance, the etch rate across the substrate, then it is conceivable that spatial component differences can be subjected to linear superposition, i.e added and subtracted, to minimize the magnitudes of all spatial components and, therefore, produce a uniform process. A method of establishing a correlation between changes in controllable process parameters and spatial components utilizing multivariate analysis is now described to determine the right combination of variables to produce a uniform process.

The table provided in FIG. 11 presents the relative change in amplitude of each spatial component through the first sixteen (16) components for twelve (12) variations in controllable process parameters. The controllable process parameters include, for example: (1) increase in process pressure, (2) decrease in process pressure, (3) increase in (Helium) backside gas pressure, (4) decrease in (Helium) backside gas pressure, (5) increase in $CF_4$ partial pressure, (6) decrease in $CF_4$ partial pressure, (7) increase in RP power, (8) decrease in RF power, (9) increase in substrate temperature, (10) decrease in substrate temperature, (11) the use of a 12 mm focus ring, and (12) the use of a 20 mm focus ring (instead of the nominal 16 mm focus ring). Each of the above exemplary controllable process parameters are measurable and adjustable with reference to FIGS. 1 through 5. The process pressure can be adjusted and monitored during process using either changes in, for example, the gate valve setting or the total process gas mass flow rate, in concert with a pressure measuring device 52. The forward and reflected RF power can be adjusted and monitored using commands to the RF generator 30 (FIG. 2), the match network 32 (FIG. 2), a dual directional coupler (not shown) and power meters (not shown). The $CF_4$ partial pressures can be adjusted and monitored using a mass flow controller to regulate the flow of $CF_4$ gas. The (Helium) backside gas pressure can be adjusted and monitored using backside gas delivery system 26, which includes a pressure regulator. In addition, the substrate temperature can be monitored using temperature monitoring system 27.

In an alternate embodiment, controllable process parameters can include a film material viscosity, a film material surface tension, an exposure time, a depth of focus, etc.

With continuing reference to the table in FIG. 11, data can be recorded and stored digitally on controller 55 as a data matrix $\bar{X}$, wherein each column in the matrix $\bar{X}$ corresponds to a given variation in a controllable process parameter (column in the table of FIG. 11) and each row in the matrix $\bar{X}$ corresponds to a specific spatial component. Hence, a matrix $\bar{X}$ assembled from the data in FIG. 11 has the dimensions 16 by 12, or more generally, m by n. Once the data is stored in the matrix, the data can be mean-centered and/or normalized, if desired. Centering the data stored in a matrix column involves computing the mean value of the column elements and subtracting it from each element. Moreover, the data residing in a column of the matrix can be normalized by the standard deviation of the data in the column. The following sections will now discuss the methods by which one determines the extent to which variations in controllable process parameters contribute to the spectral signature of spatial components.

In order to determine the inter-relationships between variations in controllable process parameters and the spatial components, the matrix $\overline{X}$ is subject to multivariate analysis. In one embodiment, principal components analysis (PCA) is employed to derive a correlation structure within matrix $\overline{X}$ by approximating matrix $\overline{X}$ with a matrix product $(\overline{TP^T})$ of lower dimensions plus an error matrix $\overline{E}$, viz.

$$\overline{X} = \overline{TP^T} + \overline{E}, \quad (1)$$

where $\overline{T}$ is a (m by p) matrix of scores that summarizes the $\overline{X}$-variables and $\overline{P}$ is a (n by p, where p≦n) matrix of loadings showing the influence of the variables.

In general, the loadings matrix $\overline{P}$ can be shown to comprise the eigenvectors of the covariance matrix of $\overline{X}$, where the covariance matrix $\overline{S}$ can be shown to be $$\overline{S} = \overline{X}^T \overline{X}. \quad (2)$$

The covariance matrix $\overline{S}$ is a real, symmetric matrix and, therefore, it can be described as $$\overline{S} = \overline{U \Lambda U^T}, \quad (3)$$

where the real, symmetric eigenvector matrix U comprises the normalized eigenvectors as columns and $\overline{\Lambda}$ is a diagonal matrix comprising the eigenvalues corresponding to each eigenvector along the diagonal. Using equations (1) and (3) (for a full matrix of p=n; i.e. no error matrix), one can show that $$\overline{P} = \overline{U} \quad (4)$$

and $$\overline{T^T T} = \overline{\Lambda}. \quad (5)$$

A consequence of the above eigenanalysis is that each eigenvalue represents the variance of the data in the direction of the corresponding eigenvector within n-dimensional space. Hence, the largest eigenvalue corresponds to the greatest variance in the data within the n-dimensional space whereas the smallest eigenvalue represents the smallest variance in the data. By definition, all eigenvectors are orthogonal and, therefore, the second largest eigenvalue corresponds to the second greatest variance in the data in the direction of the corresponding eigenvector which is, of course, normal to the direction of the first eigenvector. In general, for such analysis, the first three to four largest eigenvalues are chosen to approximate the data and, as a result of the approximation, an error $\overline{E}$ is introduced to the representation in equation (1). In summary, once the set of eigenvalues and their corresponding eigenvectors are determined, a set of the largest eigenvalues can be chosen and the error matrix $\overline{E}$ of equation (1) can be determined.

Figure 12:
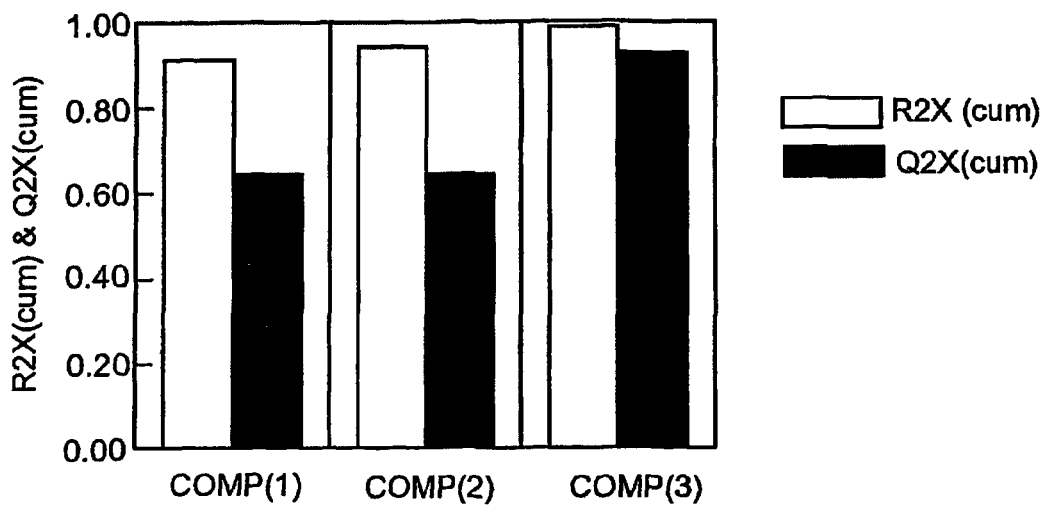
FIG. 12 presents an exemplary plot of the cumulative sum of squares and cumulative sum of variations to the sum of squares for three principal components.

An example of commercially available software which supports PCA modeling is SIMCA-P 8.0; for further details, see the User's Manual (*User Guide to SIMCA-P 8.0: A new standard in multivariate data analysis*, Umetrics AB, Version 8.0, September 1999). The contents of the manual are incorporated herein by reference. Using SIMCA-P 8.0, for example, with the data of FIG. 11, one can determine the scores matrix $\overline{T}$ and the loadings matrix $\overline{P}$, as well as additional information regarding the ability of each component to describe each variable in $\overline{X}$ and the total variation of each variable in $\overline{X}$ by a component. FIG. 12 presents the cumulative sum of squares R2X (cum.) of all of the variables in $\overline{X}$ explained by the extracted principal component(s) for the first three principal components and the cumulative sum of the total variation of each variable in $\overline{X}$ that can be predicted by the extracted principal component(s) for the first three principal components.

Figure 13A:
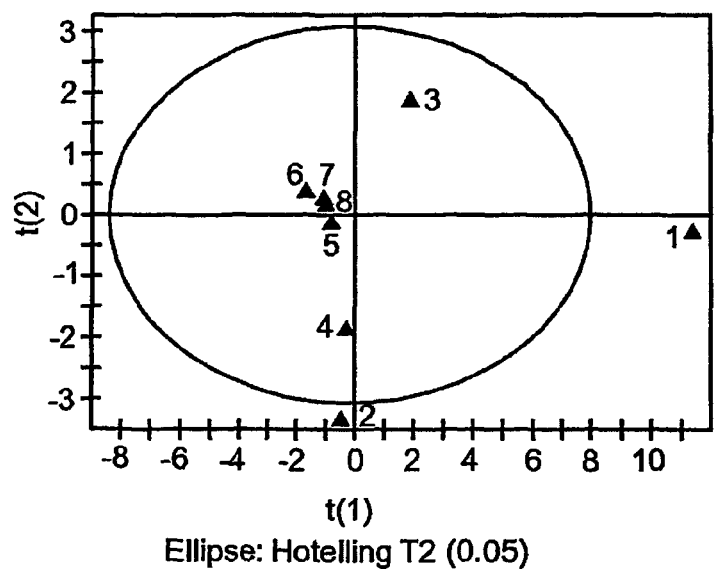
FIG. 13A presents the scores corresponding to each spatial component in t(1), t(2) space provided the exemplary data of FIG. 11.
Figure 13B:
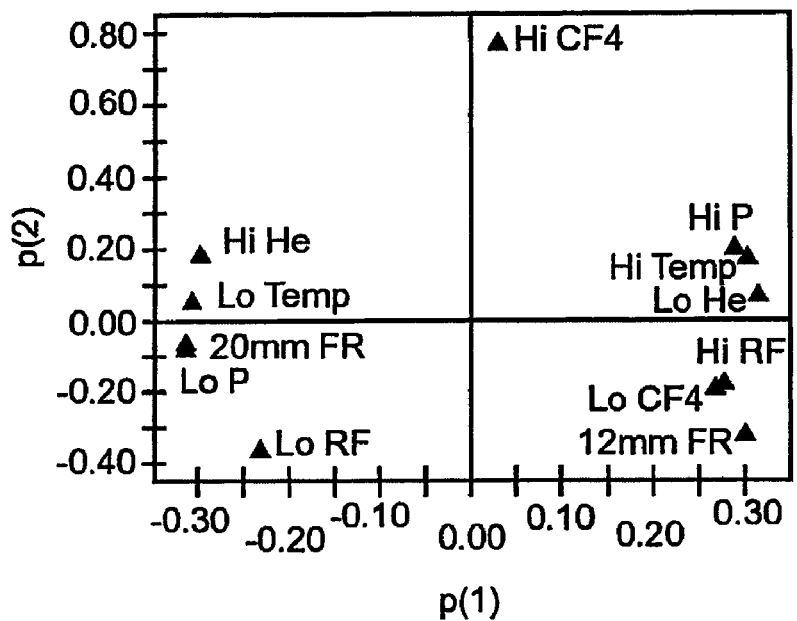
FIG. 13B presents the loadings for each variable in p(1), p(2) space provided the exemplary data of FIG. 11.

FIG. 13A presents the scores for each spatial component in t(1), t(2) space provided the exemplary data of FIG. 11 and FIG. 13B presents the loadings for each variable in p(1), p(2) space provided the exemplary data of FIG. 11. The data of FIG. 13A, in t(1)-t(2) space, displays the data variability through a measure of dispersion from the data center where, in particular, spatial components 1 and 2 are shown to reside outside the Hotelling T2 (5%) ellipse. This result indicates one should investigate the first and second principal components as shown in FIG. 13B and should further consider also components 3 and 4. From FIG. 13B, one can derive that the variations in controllable process parameters that would lead to a reduction in the magnitude of the spatial components could potentially be increasing the cooling gas pressure (i.e. helium backside pressure), decreasing the substrate holder temperature, decreasing the process pressure, decreasing the RP power and utilizing a 20 mm focus ring.

Figure 14A:
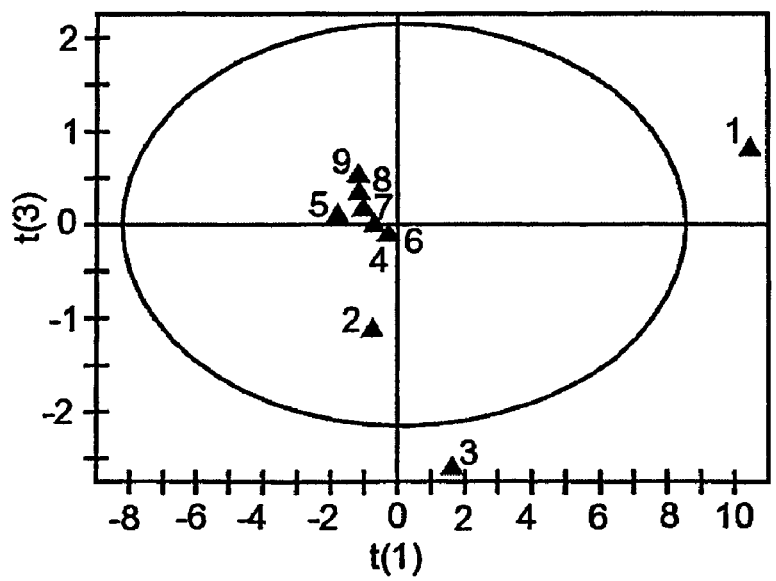
FIG. 14A presents the scores corresponding to each spatial component in t(1), t(3) space provided the exemplary data of FIG. 11.
Figures 14B, 15:
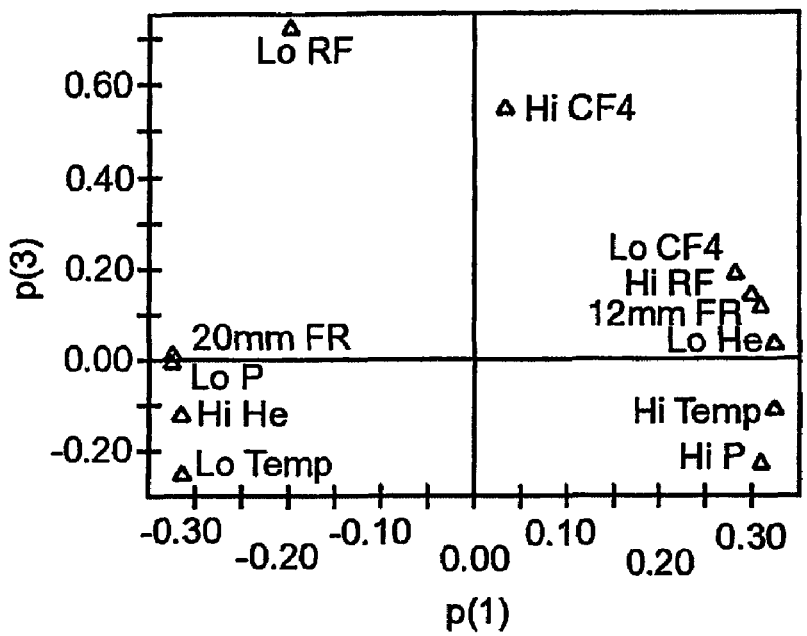
FIG. 14B presents the loadings for each variable in p(1), p(3) space provided the exemplary data of FIG. 11.
FIG. 15 presents an exemplary table summarizing data presented in FIGS. 13A,B and 14A,B.

Moreover, FIG. 14A presents the scores for each spatial component in t(1), t(3) space provided the exemplary data of FIG. 11 and FIG. 14B presents the loadings for each variable in p(1), p(3) space provided the exemplary data of FIG. 11. A similar conclusion can be drawn from analysis of FIGS. 14A and 14B and, therefore, the results of this analysis for generating a reduction of the spatial components is summarized in the table of FIG. 15.

Figure 16B:
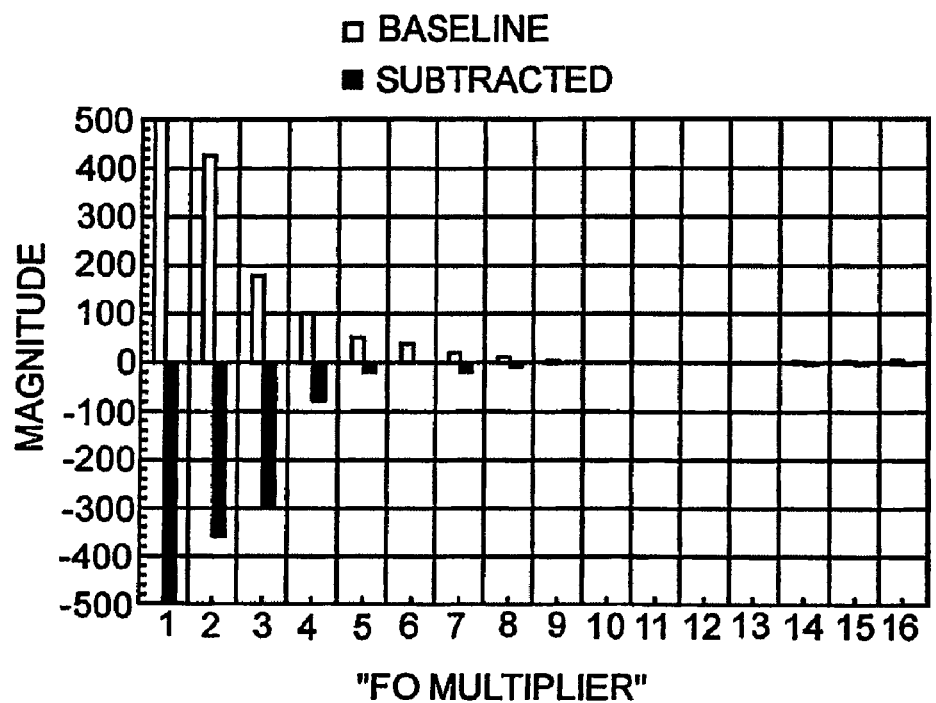
FIG. 16B presents a spectrum of spatial components according to the data of FIGS. 6A,B, and a spectrum of spatial components according to the data of FIG. 16A.
Figure 16C:
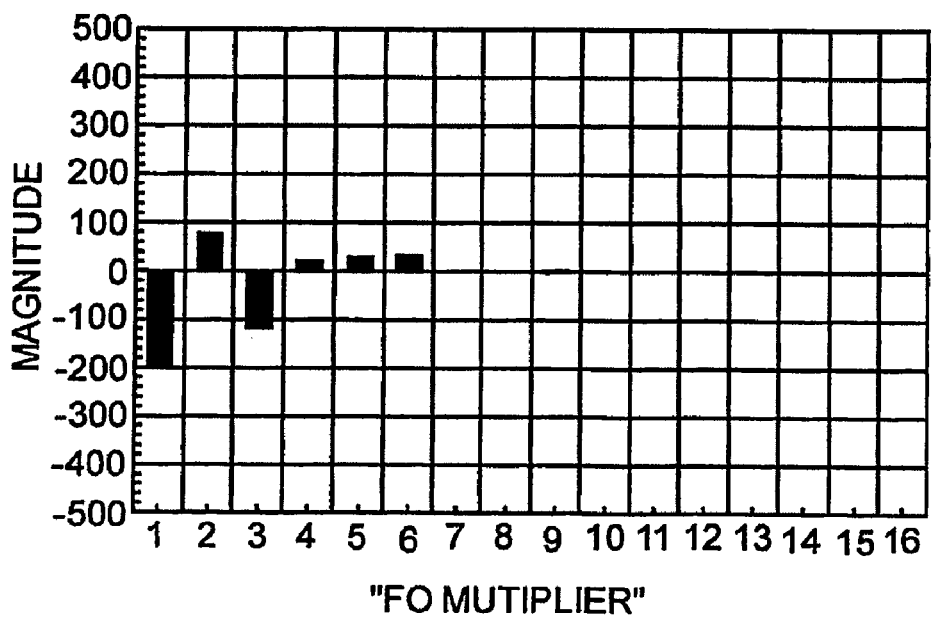
FIG. 16C presents a difference spectrum obtained from the spectra of FIG. 16B.
Figure 17:
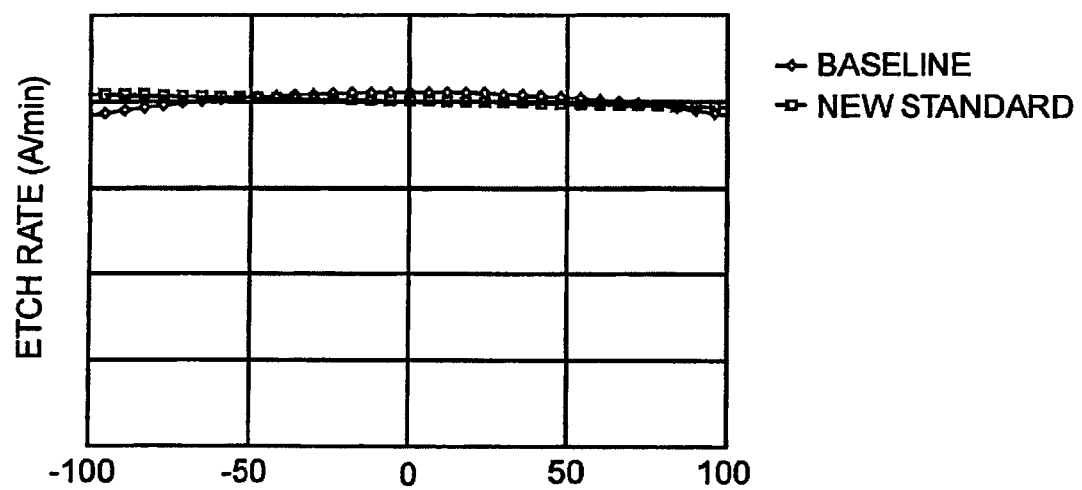
FIG. 17 shows a data scan of a first etch profile according to the data of FIGS. 6A,B, and a data scan of a second etch profile according to the data of FIG. 16C.

Utilizing the multivariate analysis summarized in FIG. 15 in conjunction with the data of FIG. 11, one can reduce the data set of FIG. 11 to a more manageable set of data shown in the table of FIG. 16A. From the table of FIG. 16A and the (baseline) signature presented in FIGS. 6A,B, FIG. 16B presents a measured signature (baseline condition) and a correction (subtracted condition) signature according to the multivariate analysis, and FIG. 16C presents the difference signature once the correction (subtracted) signature is removed from the measured signature. After adjusting the controllable process parameters following the guidelines of the multivariate analysis to affect the difference signature of FIG. 16C, an improved spatial uniformity of the scan of data for a process performance parameter is achieved and shown relative to the nominally measured scan of data in FIG. 17. In FIG. 17, the uniformity is improved by more than an order of magnitude (i.e. approximately 5% to 0.5%).

In an alternate embodiment, the implementation of multivariate analysis to determine a relationship between the controllable process parameters and the spatial components of process performance parameters can be achieved via design of experiment (DOE) methodologies. DOE methodologies are well known to those skilled in the art of experiment design.

Figure 18A:
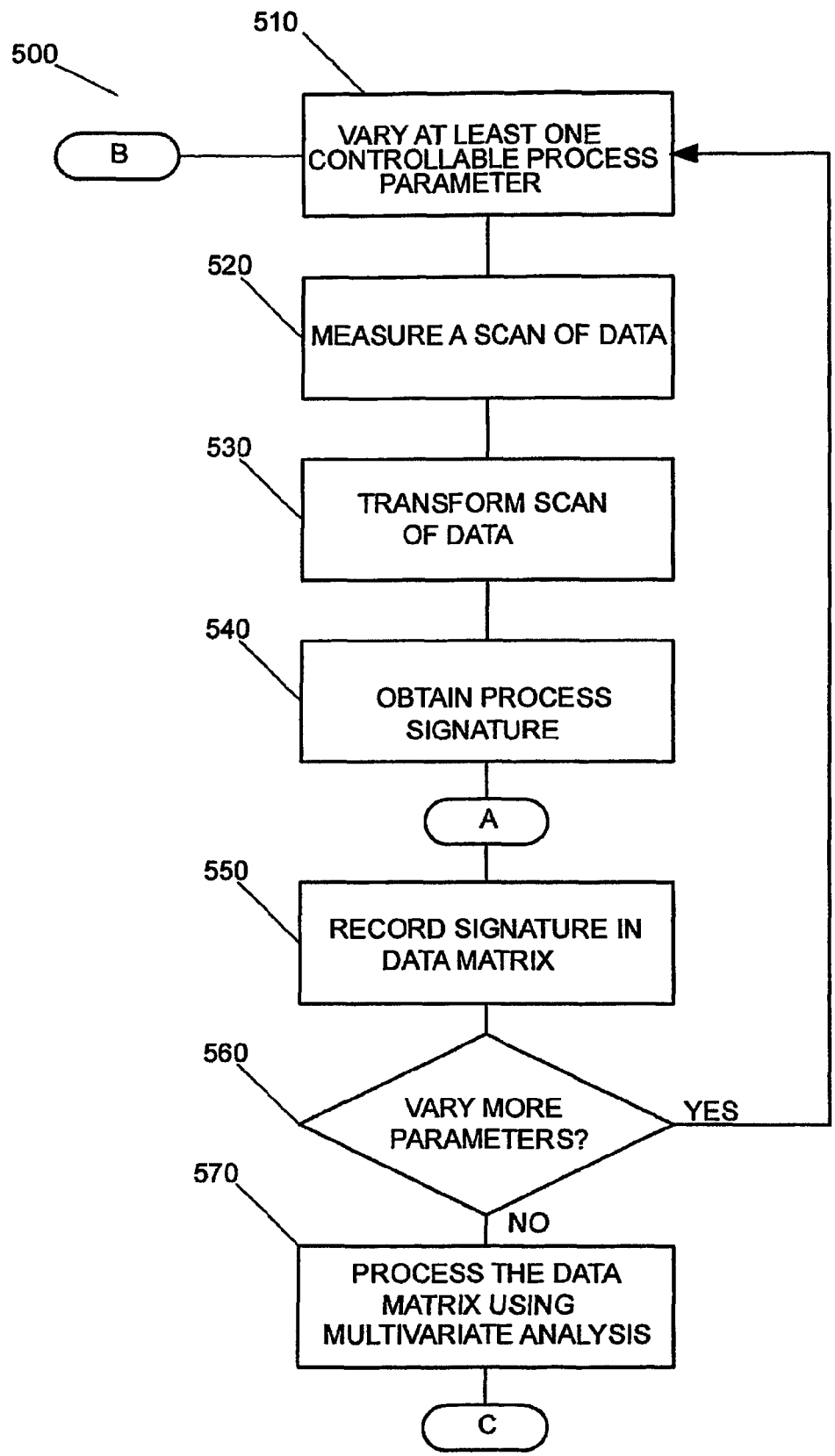
FIG. 18A presents a flow diagram of a method according to the present invention.

With reference now to FIG. 18A, a method of characterizing a material processing system according to an embodiment of the present invention is presented. The method 500 is described as a flow chart beginning with step 510 in which a controllable process parameter associated with a process performed in the material processing system is varied. The process performed in the material processing system can be, for example, the act of processing a substrate using a material processing system such as, for example, one of those described in FIGS. 1 through 5. In step 520, a scan of data, the data comprising a process performance parameter (PPP) as discussed above (i.e. etch rate, deposition rate, etc.), at, for example, two or more points above the substrate is measured and recorded. In step 530, the scan of data is transformed into spectral space. In step 540, a characterization of the material processing system is performed by identifying a process signature of the process performance parameter using one or more spatial components. Thereafter, in step 550, the process signature can be recorded in a data matrix as, for example, a column in a data matrix.

In step 560, a decision is made as to whether an additional controllable process parameter should be varied. In order to further characterize the material processing system, steps 510 through 540 can be repeated, wherein an additional controllable process parameter associated with a process performed in the material processing system is varied, an additional scan of data comprising a measurement of a process performance parameter is measured, an additional number of spatial components is determined from transforming the additional scan of data, and the material processing system is re-characterized by including an additional process signature comprising an additional number of spatial components. Furthermore, as before, the process signature can be stored in an additional column of the matrix in step 550.

In step 570, the data assembled in the data matrix can be further processed utilizing multivariate analysis in order to determine inter-relationships between the variations in the controllable process parameters and the spatial components. Examples of multivariate analysis are principal components analysis (PCA) and design of experiment (DOE), which are described above.

Figure 18B:
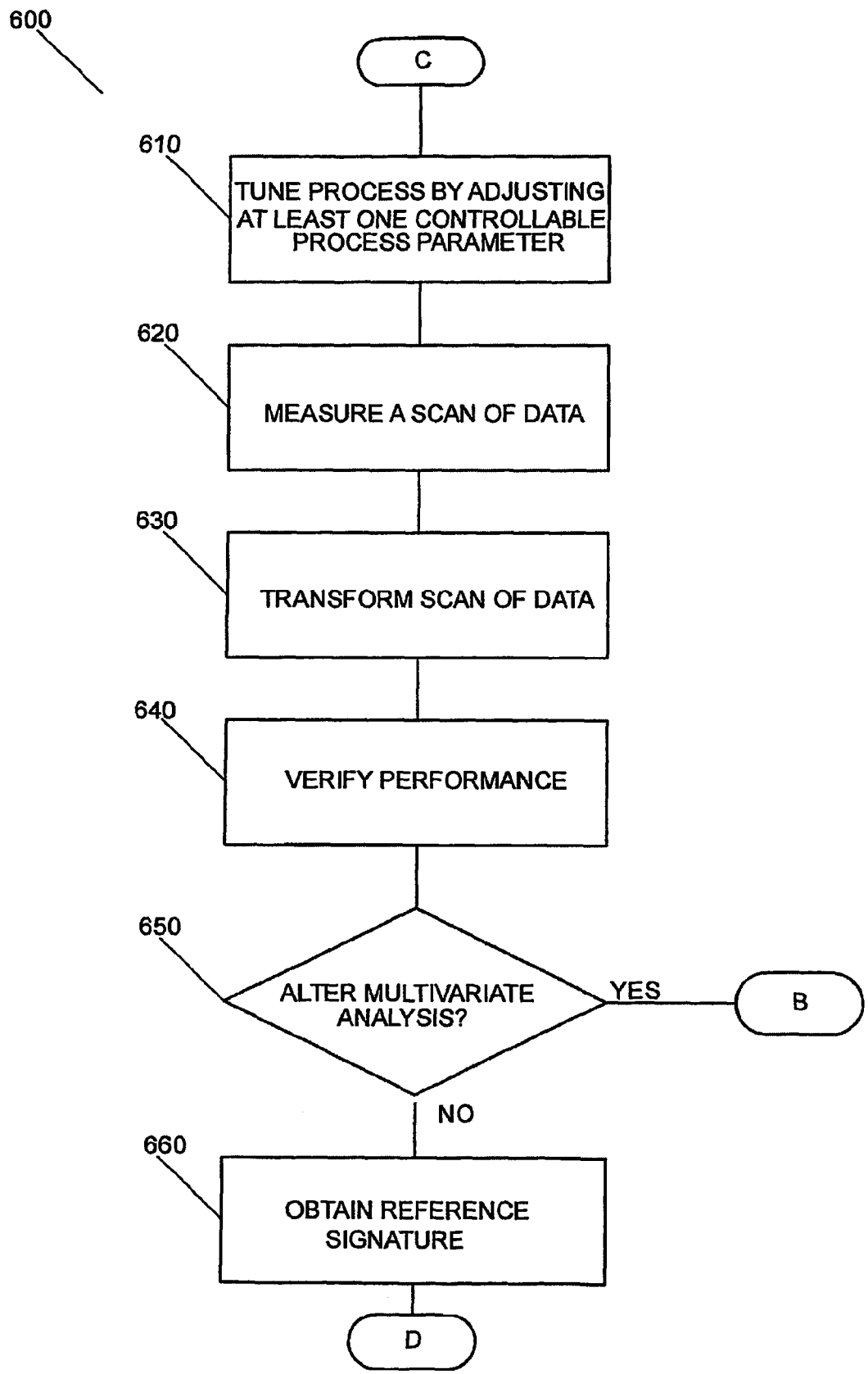
FIG. 18B presents a flow diagram of an additional method according to the present invention.

Referring now to FIG. 18B, a method for optimizing a process in the material processing system is described. In the method, a reference signature, deemed optimum for the given process performed in the material processing system, can be obtained. Utilizing the inter-relationships between variations in controllable process parameters and spatial components, the process is tuned by adjusting at least one controllable process parameter in step 610. In steps 620, 630 and 640, a scan of data corresponding to a process performance parameter is measured (step 620), the scan of data is transformed into spectral space to form a number of spatial components (step 630), and the resulting process signature is verified (step 640). In the verifying step 640, the process signature is assessed to determine if the optimization of the process signature was successful. For example, if the optimal process is a uniform process, then the optimized process signature should comprise minimal amplitudes for each of its spatial components. If the verifying step 640 indicates a successful optimization, then the multivariate analysis is not altered in step 650 and a reference signature for the process in the material processing system is obtained in step 660. If the verifying step 640 indicates an unsuccessful optimization, then the multivariate analysis can be altered and a series of steps described in FIG. 18A can be re-executed.

Figure 18C:
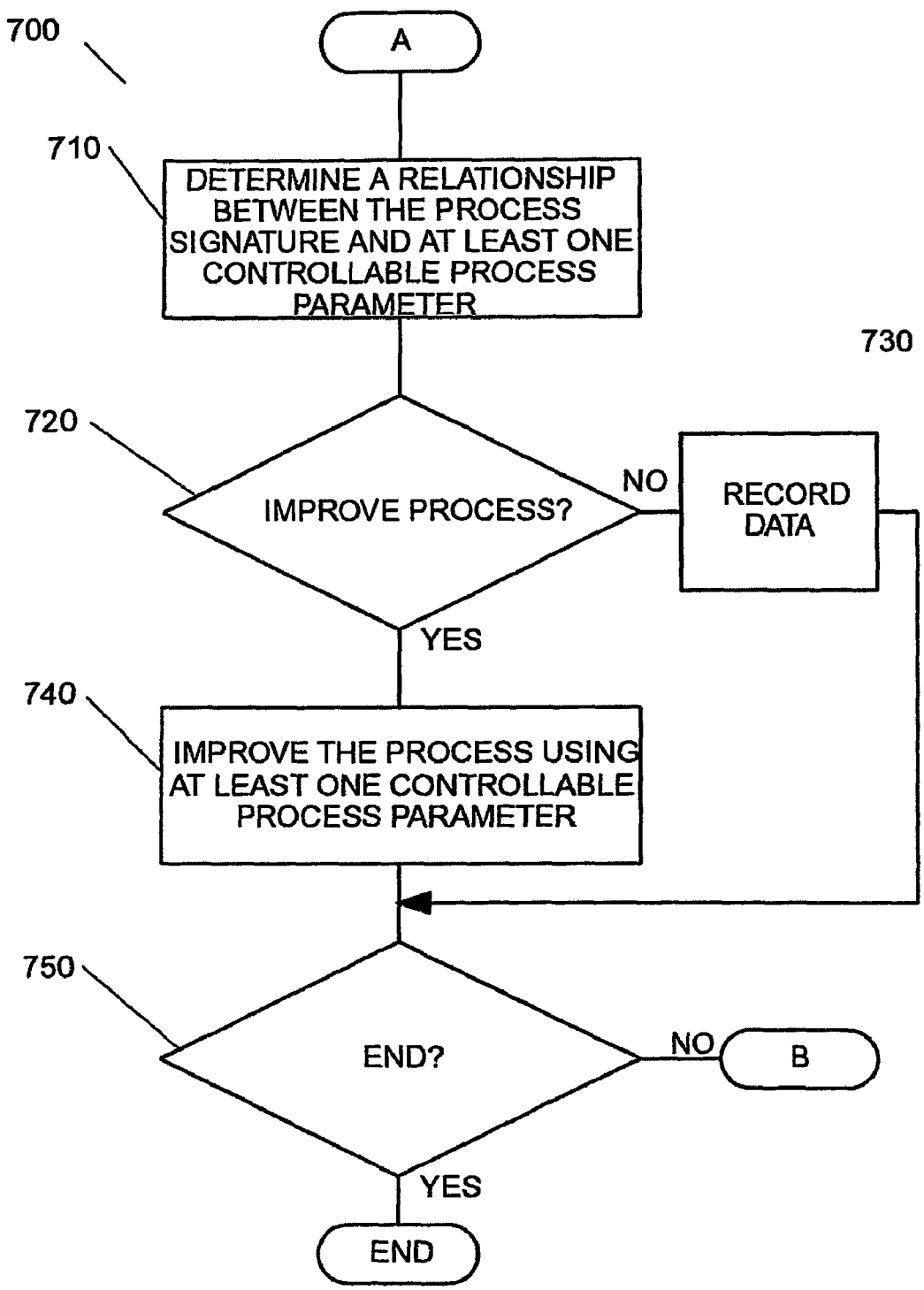
FIG. 18C presents a flow diagram of an additional method according to the present invention.

Referring now to FIG. 18C, a method 700 for improving a process in a material processing system is described. In step 710, a relationship between the process signature and a controllable process parameter is determined. The relationship can be determined, for example, using data inspection, or any of the multivariate analyses described above (i.e. PCA, DOE, etc.). In step 720, a decision is made as to whether to improve the process. The improvement can, for example, involve improving the uniformity of the process performance parameter. In such a case, it would be advantageous to alter the process in order to minimize the amplitudes of at least one spatial component in the process signature, or minimize a difference signature formed from the subtraction of the process signature (FIG. 18A) from the reference signature (FIG. 18B). If no improvement is deemed necessary, all process data including the process recipe and process signature is recorded in step 730. If an improvement is deemed necessary, then the process is improved using a variation in at least one controllable process parameter in step 740. In step 750, a decision is made as to whether the method should be terminated. If not, the next process (i.e. next substrate, next batch, etc.) can proceed.

Figure 18D:
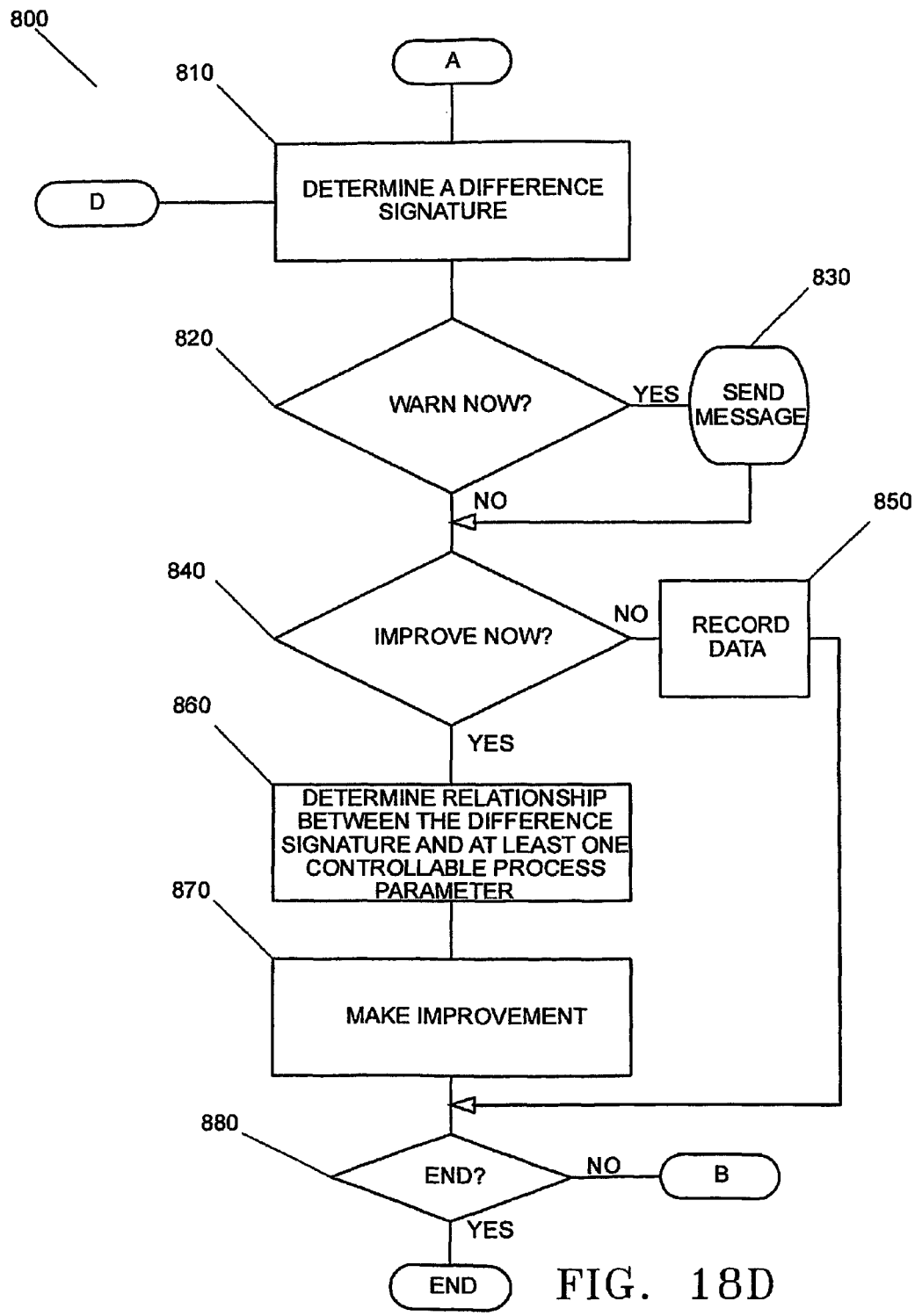
FIG. 18D presents a flow diagram of an additional method according to the present invention.

With reference now to FIG. 18D, a method according to an embodiment of the present invention is presented. The method 800 is described as a flow chart beginning with step 810 wherein the measured process signature (FIG. 18A) is compared with a reference signature (FIG. 18B) and a difference signature is computed as the difference between the measured process signature and the reference signature. The reference signature can be an ideal signature determined for the process or a signature obtained for a prior substrate. For example, the reference signature could constitute a spectrum of spatial components ideal for process uniformity. If the difference signature exceeds a threshold, then a process fault is detected and the operator can be notified. Upon detection of a process fault, an alarm can be triggered in step 820 and a message can be sent to an operator (either locally or remotely) in step 830.

In one embodiment, the threshold is exceeded when the difference signature for any one spatial component exceeds a fraction of the reference value for the spatial component. For example, when the aforesaid fractional deviation exceeds 20%, then the operator is alerted to perform the possibility of a process fault. The fault alarm can be indicative of the need for preventive maintenance, i.e. chamber cleaning or consumable replacement, or a defective process. In fact, a hierarchy of operator notifications can be employed, for example, a 10% fractional deviation can lead to an operator warning, a 15% fractional deviation can lead to an operator request for preventative maintenance scheduling and a 20% fractional deviation can lead to emergency notification for immediate attention. (Likewise, a programmed deviation may even be programmed to cause an automatic shut down of the malfunctioning equipment.) The controller 55 of FIGS. 1 through 5 can be connected via an integrated circuit (IC) manufacturing plant intranet to a centralized plant server for notification of a fab operator and/or an equipment supplier server located in the fab through which notification may be sent to the equipment supplier off-site via the internet.

In an alternate embodiment, the threshold is exceeded when the sum of the spatial components comprising the difference signature exceeds a fraction of the sum of the spatial components comprising the reference signature. For example, when the aforesaid fractional deviation exceeds 20%, then the operator is alerted to perform the possibility of a process fault.

After a decision as to whether to send a warning in step 820 is made, a decision can be made as to whether to improve the process in step 840. If an improvement is not necessary, all data including process recipe, spatial components, etc. can be recorded in step 850. If an improvement is deemed necessary, then a relationship between the difference signature and at least one controllable process parameter can be determined in step 860 and an improvement can be made through adjustment of at least one controllable process parameter in step 870. In step 880, a decision as to whether to end the process is made. If not, the next process or a new process can be executed while referring back to FIG. 18A.

In the embodiments described herein, a one-dimensional scan of data has been utilized to determine a set of spatial components. In an alternate embodiment, the scan of data can be multi-dimensional such as, for example, at least a two-dimensional scan of data.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method of material processing, the method comprising:
characterizing a process, said characterizing comprising measuring a process performance parameter at a plurality of positions on a sample to obtain measurement data and transforming the measurement data into at least one spatial component in spectral space to identify a measured signature of said process, wherein said measured signature comprises the at least one spatial component in spectral space;
optimizing said process, said optimizing comprising identifying a reference signature of said process;
comparing said measured signature of said process with said reference signature for said process, wherein said comparing comprises determining a difference signature representing a difference between the measured signature and reference signature, and determining a process fault by comparing said difference signature with a threshold, wherein said process fault occurs when said threshold is exceeded; and
identifying whether a process variation is global or local based on the signature of spatial components.

2. The method according to claim 1, further comprising performing said process on a substrate.

3. The method according to claim 2, wherein said substrate is at least one of a wafer or a liquid crystal display.

4. The method according to claim 1, wherein said process performance parameter is at least one of etch rate, deposition rate, etch selectivity, etch feature anisotropy, etch feature critical dimension, film property, plasma density, ion energy, concentration of chemical specie, temperature, pressure, mask film thickness, and mask pattern critical dimension.

5. The method according to claim 1, wherein said transforming comprises applying a discrete Fourier transform to the measured data to provide said at least one spatial component as Fourier harmonics.

6. The method according to claim 1, wherein said characterizing further comprises determining a relationship between said measured signature and at least one controllable process parameter associated with the measured signature, using a multivariate analysis.

7. The method according to claim 6, wherein said multivariate analysis comprises principal components analysis.

8. The method according to claim 6, wherein said multivariate analysis comprises design of experiment.

9. The method according to claim 6, wherein said at least one controllable process parameter comprises at least one of process pressure, RF power, gas flow rate, cooling gas pressure, focus ring, electrode spacing, temperature, film material viscosity, film material surface tension, exposure intensity, and depth of focus.

10. The method according to claim 1, wherein said optimizing comprises improving spatial uniformity of said measurement data.

11. The method according to claim 1, wherein said optimizing comprises minimizing said at least one spatial component in spectral space.

12. The method according to claim 1, wherein said measuring comprises obtaining a multi-dimensional scan of data for said process performance parameter.

13. The method according to claim 12, wherein said multi-dimensional scan of data is a two-dimensional scan of data for said process performance parameter.

14. A system for material processing, the system comprising:
process chamber,
device configured to measure and adjust at least one controllable process parameter,
device configured to measure at least one process performance parameter, and
controller capable of characterizing a process, said characterizing comprising:
measuring a process performance parameter at a plurality of positions on a sample to obtain measurement data and transforming the measurement data into at least one spatial component in spectral space to identify a measured signature of said process wherein said measured signature comprises the at least one spatial component in spectral space;
optimizing said process, said optimizing comprising identifying a reference signature of said process;
comparing said measured signature of said process with said reference signature for said process, wherein said comparing comprises determining a difference signature representing a difference between the measured signature and reference signature; and
determining a process fault by comparing said difference signature with a threshold, wherein said process fault occurs when said threshold is exceeded; and
identifying whether a process variation is global or local based on the signature of the spatial components.

15. The system according to claim 14, wherein said process chamber is an etch chamber.

16. The system according to claim 14, wherein said process chamber is a deposition chamber comprising at least one of chemical vapor deposition and physical vapor deposition.

17. The system according to claim 14, wherein said process chamber is a photoresist coating chamber.

18. The system according to claim 14, wherein said process chamber is a dielectric coating chamber comprising at least one of a spin-on-glass system and a spin-on-dielectric system.

19. The system according to claim 14, wherein said process chamber is a photoresist patterning chamber.

20. The system according to claim 19, wherein said photoresist patterning chamber is an ultraviolet lithography system.

21. The system according to claim 14, wherein said process chamber is a rapid thermal processing chamber.

22. The system according to claim 14, wherein said process chamber is a batch diffusion furnace.

* * * * *